(12) United States Patent
Garner et al.

(10) Patent No.: US 12,046,481 B2
(45) Date of Patent: Jul. 23, 2024

(54) SYSTEMS AND METHODS FOR REDUCING VIA FORMATION IMPACT ON ELECTRONIC DEVICE FORMATION

(71) Applicant: CORNING INCORPORATED, Corning, NY (US)

(72) Inventors: Sean Matthew Garner, Elmira, NY (US); Robert George Manley, Vestal, NY (US); Rajesh Vaddi, Horseheads, NY (US)

(73) Assignee: Corning Incorporated, Corning, NY (US)

( * ) Notice: Subject to any disclaimer, the term of this patent is extended or adjusted under 35 U.S.C. 154(b) by 290 days.

(21) Appl. No.: 17/641,540

(22) PCT Filed: Sep. 9, 2020

(86) PCT No.: PCT/US2020/049892
§ 371 (c)(1),
(2) Date: Mar. 9, 2022

(87) PCT Pub. No.: WO2021/050514
PCT Pub. Date: Mar. 18, 2021

(65) Prior Publication Data
US 2022/0319868 A1  Oct. 6, 2022

Related U.S. Application Data

(60) Provisional application No. 62/942,450, filed on Dec. 2, 2019, provisional application No. 62/900,052, filed on Sep. 13, 2019.

(51) Int. Cl.
*H01L 21/48* (2006.01)
*H01L 21/306* (2006.01)
(Continued)

(52) U.S. Cl.
CPC ...... *H01L 21/486* (2013.01); *H01L 21/30604* (2013.01); *H01L 21/76898* (2013.01); *H01L 23/15* (2013.01); *H01L 23/5384* (2013.01)

(58) Field of Classification Search
CPC ......... H01L 21/30604; H01L 21/76898; H01L 23/15; H01L 23/5384; H01L 21/486
(Continued)

(56) References Cited

U.S. PATENT DOCUMENTS 10,424,606 B1   9/2019   Garner et al.
2006/0292866 A1  12/2006  Stupar et al.
(Continued)

FOREIGN PATENT DOCUMENTS

KR   10-2016-0134132 A   11/2016
TW      201625501 A       7/2016
(Continued)

OTHER PUBLICATIONS

International Search Report and Written Opinion of the International Searching Authority; PCT/US2020/049892; Mailed Dec. 22, 2020; 11 Pages; Korean Intellectual Property Office.
(Continued)

*Primary Examiner* — Quoc D Hoang
(74) *Attorney, Agent, or Firm* — Ryan T. Hardee; Grant A. Gildehaus

(57) ABSTRACT

Embodiments are related to systems and methods for forming vias in a substrate, and more particularly to systems and methods for reducing substrate surface disruption during via formation.

33 Claims, 18 Drawing Sheets

(51) Int. Cl.
*H01L 21/768* (2006.01)
*H01L 23/15* (2006.01)
*H01L 23/538* (2006.01)

(58) Field of Classification Search
USPC ........................................................ 257/774
See application file for complete search history.

(56) References Cited

U.S. PATENT DOCUMENTS

| | | |
|---|---|---|
| 2007/0262464 A1 | 11/2007 | Watkins et al. |
| 2009/0280643 A1 | 11/2009 | Andry et al. |
| 2010/0068453 A1* | 3/2010 | Imai .................. C03C 15/00 |
| | | 65/23 |
| 2015/0060402 A1 | 3/2015 | Burkett et al. |
| 2015/0166396 A1 | 6/2015 | Marjanovic et al. |
| 2017/0084527 A1* | 3/2017 | Seddon ............. H01L 21/02035 |
| 2017/0229318 A1 | 8/2017 | Tsunetomo et al. |
| 2017/0295652 A1 | 10/2017 | Isobe |
| 2017/0358447 A1* | 12/2017 | Tsunetomo ............ H01L 23/15 |
| 2018/0130705 A1 | 5/2018 | Huang et al. |
| 2018/0339936 A1 | 11/2018 | Ono et al. |
| 2019/0148142 A1 | 5/2019 | Tsunetomo et al. |
| 2021/0187910 A1 | 6/2021 | Manley et al. |

FOREIGN PATENT DOCUMENTS

| | | |
|---|---|---|
| TW | 201803428 A | 1/2018 |
| TW | 201901796 A | 1/2019 |

OTHER PUBLICATIONS

Taiwanese Patent Application No. 109131044, Office Action dated Mar. 21, 2024, 2 pages (English Translation only), Taiwanese Patent Office.

* cited by examiner

SYSTEMS AND METHODS FOR REDUCING VIA FORMATION IMPACT ON ELECTRONIC DEVICE FORMATION

CROSS-REFERENCE TO RELATED APPLICATIONS

This application is a national stage entry of International Patent Application Serial No. PCT/US2020/049892, filed on Sep. 9, 2020, which in turn, claims the benefit of priority under 35 U.S.C. § 119 of U.S. Provisional Application Ser. No. 62/942,450 filed on Dec. 2, 2019 and U.S. Provisional Application Ser. No. 62/900,052 filed on Sep. 13, 2019, the contents of each of which are relied upon and incorporated herein by reference in their entireties.

FIELD OF THE INVENTION

Embodiments are related to systems and methods for forming vias in a substrate, and more particularly to systems and methods for reducing substrate surface disruption during via formation.

BACKGROUND

Manufacturing of electronics devices often involves forming vias through a substrate. As an example, vias may be formed through a substrate and metalized to form an electrical connectivity from one surface of the substrate to the opposite surface. At times the metal deposited in the vias can interfere with later formation of thin-film-transistors; electrical conductor lines; and other electronic, optical, or physical elements on the surface of the substrate. In some cases, formation of the vias may degrade a surface of the substrate making it difficult to form electronic devices thereon.

Hence, for at least the aforementioned reasons, there exists a need in the art for advanced systems and methods for manufacturing electronic devices.

SUMMARY

Embodiments are related to systems and methods for forming vias in a substrate, and more particularly to systems and methods for reducing substrate surface disruption during via formation.

This summary provides only a general outline of some embodiments. The phrases "in one embodiment," "according to one embodiment," "in various embodiments", "in one or more embodiments", "in particular embodiments" and the like generally mean the particular feature, structure, or characteristic following the phrase is included in at least one embodiment, and may be included in more than one embodiment. Importantly, such phrases do not necessarily refer to the same embodiment. Many other embodiments will become more fully apparent from the following detailed description, the appended claims and the accompanying drawings.

BRIEF DESCRIPTION OF THE FIGURES

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION

Figure 1:
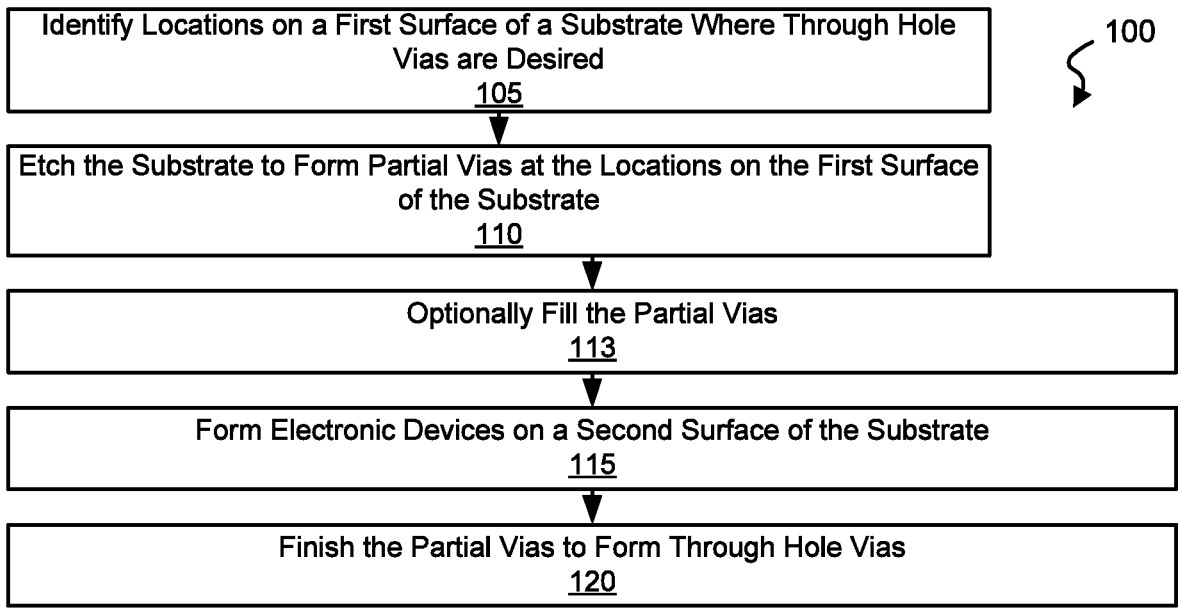
FIG. 1 is a flow diagram showing a method for manufacturing substrate systems in accordance with some embodiments.

Embodiments are related to systems and methods for forming vias in a substrate, and more particularly to systems and methods for reducing substrate surface disruption during via formation.

Various embodiments provide methods for forming vias and non-via structures in a substrate. In some cases, such substrates are transparent substrates. Such transparent substrates have a variety of applications including, but not limited to, micro light emitting diode (microLED) displays. MicroLED displays in general have benefits of higher brightness and contrast ratio as compared to liquid crystal displays (LCD) and organic light emitting diode (OLED) displays. Other benefits also exist depending on the specific application. To enable high resolution and large area displays, there is interest in fabricating microLED displays with active matrix backplanes based on oxide thin-film-transistors (TFTs) or low temperature poly-silicon (LTPS). Conventional configurations utilize top emitting microLED panels with the driver boards located on a display backside. While some embodiments discussed herein find particular application to the manufacture of microLED displays, they are not limited to microLED displays. Other applications can include antennas, circuit boards, sensors, lighting, photovoltaics, fluidics, optics and integrated optics, liquid crystal and OLED and electrophoretic and alternative displays, and other device areas. Based upon the disclosure provided herein, one of ordinary skill in the art will recognize a variety of applications beyond microLED displays to which the embodiments discussed herein may be applied.

As used herein, the term "via" is used in its broadest sense to include any opening extending into a surface, such as, but not limited to, through-hole vias, blind vias, or other bulk features that can be predefined before fabrication of electronic devices on the surface of the transparent substrate. Such pre-definition before fabrication may include, but is not limited to, creating a pattern corresponding to a latent via that is subsequently processed into a formed via.

As used herein, the term "substrate" is used in its broadest sense to mean any work piece having at least a first surface and a second surface opposite the first surface. As an example, a substrate may be a glass work piece, a ceramic work piece, a glass-ceramic work piece, a polymer work piece, or a multi-layer composite of one or more of the aforementioned materials. As used herein, the phrase "transparent substrate" is used in its broadest sense to mean any work piece having at least a first surface and a second surface opposite the first surface and formed from a material that is sufficiently transparent to allow for at least some light emitted from a light source to pass through the substrate. The light, for example, can be from the ultraviolet, visible, near infrared, and infrared regions of the electromagnetic spectrum. As an example, a transparent substrate may be, but is not limited to, a work piece made of a material with an optical absorption of less than about twenty percent (20%) per millimeter depth. As another example, a transparent substrate may be, but is not limited to, a work piece made of a material with an optical absorption of less than about ten percent (10%) per millimeter depth for a specified pulsed laser wavelength. As yet another example, a transparent substrate may be, but is not limited to, a work piece made of a material with an optical absorption of less than about one percent (1%) per millimeter depth for a specified pulsed laser wavelength. A transparent substrate can be made of glass, glass ceramic, ceramic, polymer, or other material depending upon the particular application, and may consist of a single layer of a single material, a composite, or a multi-layer stack of different or the same materials, including one or more of the aforementioned materials. The substrate can be a rigid sheet or a flexible substrate compatible with roll-to-roll processing. As used herein, the term "substrate" unmodified by the term "transparent" can refer to a transparent substrate as previously described, and can also include materials having any degree of transparency or opaqueness with respect to light from any source or wavelength. Based upon the disclosure provided herein, one of ordinary skill in the art will recognize a variety of substrates and/or transparent substrates that may be used in relation to different embodiments.

Metalized vias in a substrate are an option for interconnecting the microLED and TFT arrays on the substrate top surface with the driver boards or other electronics on an opposite surface. Although the terms metallized vias or metal in vias are used, this refers to any electrically conductive material that can be placed in a via to electrically interconnect the top and bottom surfaces of the substrate. These conductive materials can include metal, conductive oxides, conductive polymers, conductive pastes, or other materials. The traditional printed circuit board assembly methodology (e.g., glass printed circuit board) including formation and metallization of vias followed by formation of electrical devices in relation to the vias has demonstrated various limits when applied to transparent substrate based display manufacture. Such limits include, but are not limited to, 1) non-planarity of the substrate surface after via formation, 2) metal contamination of the electronic devices formed on the substrate by via metallization, and 3) significant thermal expansion differences between the metal in the via and the surrounding substrate. Other approaches involve forming TFTs, or other elements on one surface of a substrate followed by forming vias through the substrate using a combination of laser damage and etching. Performing laser damage followed by etching through the substrate from one surface to the other surface after formation of the TFTs involves considerable etching time which can negatively impact previously formed TFTs. Similarly, using laser ablation to form a via from one surface to the other surface after formation of the TFTs is time consuming, creates considerable debris, and potentially damages TFTs in the laser affected zone.

As used herein, the phrase "electronic device" is used in its broadest sense to mean any structure that is either powered or controlled by application of an electrical voltage, current, and/or an electrical signal, and/or any element or structure that operates in relation to a structure either powered or controlled by application of an electrical voltage, current, and/or signal. Thus, an electronic device includes, but is not limited to, a thin film transistor, a metal conductor line, an active matrix backplane, a passive matrix interconnect, an LED, an IC, packaged or non-packaged electronic elements, an optical structure separate from an LED but used in relation to an LED, and/or a fluidic element. Based upon the disclosure provided herein, one of ordinary skill in the art will recognize a variety of electronic devices (either fully or partially formed) that may be used in relation to different embodiments. In addition, embodiments may also be used for non-electronic device applications such as optical or fluidic applications as examples.

The terms "substantial," "substantially," and variations thereof as used herein are intended to note that a described feature is equal or approximately equal to a value or description. For example, a "substantially planar" surface is intended to denote a surface that is planar or approximately planar. Moreover, as defined above, "substantially similar" is intended to denote that two values or conditions are equal or approximately equal. In some embodiments, "substantially similar" may denote values within about 10% of each other, such as within about 5% of each other, or within about 2% of each other.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. In some cases, the partial via extends at least seventy percent of the distance between the first surface and the second surface. In some cases, the partial via extends at least ninety percent of the distance between the first surface and the second surface. In some cases, multiple partial vias exist and extend differing distances between the first surface and the second surface. These multiple partial vias may differ in diameter.

Some embodiments provide methods for processing a substrate. The methods include: forming a partial via extending from a first surface of a substrate; forming a non-via structure over the second surface of the substrate and away from an area above the partial via; and after forming the non-via structure over the second surface of the substrate, removing a portion of the substrate to convert the partial via to a full via extending from the first surface of the substrate to the second surface of the substrate. The substrate exhibits a distance between the first surface and a second surface along a line perpendicular to both the first surface and the second surface. The partial via extends into the substrate less than one hundred percent of the distance between the first surface and the second surface. In some cases, the non-via structure is a thin film transistor.

In some instances of the aforementioned embodiments, the substrate is a transparent substrate. In various cases, the partial via extends at least ten percent of the distance between the first surface and the second surface. In some cases, the partial via extends at least twenty percent of the distance between the first surface and the second surface. In various cases, the partial via extends at least thirty percent of the distance between the first surface and the second surface. In some cases, the partial via extends at least fifty percent of the distance between the first surface and the second surface. In some cases, the partial via extends at least seventy percent of the distance between the first surface and the second surface. In some cases, the partial via extends at least ninety percent of the distance between the first surface and the second surface. In some cases, multiple partial vias exist and extend differing distances between the first surface and the second surface. These multiple partial vias may differ in diameter.

In some instances of the aforementioned embodiments, removing the portion of the substrate to convert the partial via to the full via extending from the first surface of the substrate to the second surface of the substrate includes laser ablation from the second surface of the substrate or laser ablation from the first surface of the substrate. In some instances of the aforementioned embodiments, removing the portion of the substrate to convert the partial via to the full via extending from the first surface of the substrate to the second surface of the substrate includes etching of the substrate. In some instances of the aforementioned embodiments, removing the portion of the substrate to convert the partial via to the full via extending from the first surface of the substrate to the second surface of the substrate includes mechanical processing. In various instances of the aforementioned embodiments, removing the portion of the substrate to convert the partial via to the full via extending from the first surface of the substrate to the second surface of the substrate includes: exposing the substrate to a defined wavelength of light that penetrates through the substrate at a location corresponding to the partial via to create a path from the second surface of the substrate to the partial via along which at least one characteristic of the substrate material has been changed compared with material of the substrate that was not exposed to the defined wavelength of light; and etching the substrate using an etchant that etches the substrate material with the changed characteristic at a rate higher than the substrate material that does not exhibit the changed characteristic. Any location on the second surface used to complete the via opening does not need to be centrally aligned with the partial via but can be offset as long as it results in a continuous opening when completed.

In some instances of the aforementioned embodiments, the methods further include: forming a protective material over the non-via structure prior to removing the portion of the substrate to convert the partial via to the full via extending from the first surface of the substrate to the second surface of the substrate. This protective material may be continuous across the substrate surface or have patterned openings. These openings may be aligned to the partial vias on the first surface. In some instances of the aforementioned embodiments, the methods further include: forming a protective material partially over the first surface prior to removing the portion of the substrate to convert the partial via to the full via extending from the first surface of the substrate to the second surface of the substrate. In some such instances, removing the portion of the substrate to convert the partial via to the full via extending from the first surface of the substrate to the second surface of the substrate includes wet etching from at least the second surface of the substrate. In some such instances, removing the portion of the substrate to convert the partial via to the full via extending from the first surface of the substrate to the second surface of the substrate includes wet etching from at least the first surface of the substrate. Suitable electrically conductive materials can comprise, but are not limited tometals, for example copper, silver, gold, aluminum, zinc, nickel, or alloys thereof. In further embodiments, suitable conductive materials can comprise non-metallic electrical conductors such as, but not limited to, graphiteand/or conductive polymers. As used herein, a conductive material is a material for which $\varepsilon''/\varepsilon' \geq 1$, where $\varepsilon'$ and $\varepsilon''$ represent the real and imaginary components of permittivity, respectively. In various embodiments, a conductive material can be a material for which $\varepsilon''/\varepsilon' \gg 1$.

In some instances of the aforementioned embodiments, forming the partial via extending from the first surface of the substrate includes exposing the substrate to a wet etch. In various instances of the aforementioned embodiments, the methods further include: forming a conductive material in the full via. In some instances of the aforementioned embodiments, the methods further include forming a protective material in the partial via. In some such instances, the protective material is a conductive material.

Other embodiments provide electronic systems that include a substrate having a first surface and a second surface. The substrate exhibits a distance between the first surface and the second surface along a line perpendicular to both the first surface and the second surface, and the substrate has a partial via extending from the first surface of the substrate less than one hundred percent of the distance between the first surface and the second surface. The systems further include a non-via structure over the second surface of the substrate and away from an area above the partial via.

In some instances of the aforementioned embodiments, the substrate is a transparent substrate. In various instances of the aforementioned embodiments, In various cases, the partial via extends at least ten percent of the distance between the first surface and the second surface. In some cases, the partial via extends at least twenty percent of the distance between the first surface and the second surface. In various cases, the partial via extends at least thirty percent of the distance between the first surface and the second surface. In some cases, the partial via extends at least fifty percent of the distance between the first surface and the second surface. In some cases, the partial via extends at least seventy percent of the distance between the first surface and the second surface. In some cases, the partial via extends at least ninety percent of the distance between the first surface and the second surface. In some instances of the aforementioned embodiments, the partial via is at least partially filled with a material different from the material of the substrate. In various instances of the aforementioned embodiments, the non-via structure is covered by a protective material. In some cases, the non-via structure is a thin film transistor.

Turning to FIG. 1, a flow diagram 100 shows a method for manufacturing substrate systems in accordance with some embodiments where partial vias are formed before at least part of an electronic device has been formed, and later the partial vias are converted to through-hole vias by removing portions of the substrate corresponding to respective locations of the partial vias after at least part of the electronic device has been formed. Such an approach to making substrate systems, inter alia, allows for the formation of electronic devices on a substrate surface (e.g., a second surface) that is only minimally impacted by via formation. This approach to making substrate systems, inter alia, provides versatility that allows for the via formation processes (both partial via formation, and conversion of the partial via to a through-hole via) to be performed at optimized times in a manufacturer's standard processes.

Following flow diagram 100, locations on a first surface of a substrate are identified where through-hole vias are desired (block 105). The transparent substrate may be formed of any of a number of materials including, but not limited to, glass, glass-ceramic, ceramic, polymer, or a multi-layer composite of one or more of the aforementioned materials. In some cases, the substrate is a transparent substrate. As an example, the substrate can be a Corning® EAGLE XG®, Lotus™ NXT, or other alkaline earth boro-aluminosilicate substrate. As an example, the substrate can be high purity fused silica or an alkali-ion containing glass. In such cases, substrate thickness (defined between opposing major surfaces of the substrate along a normal to the surfaces) can range between 0.1 millimeter (mm) to 1.0 mm. In various cases, substrate thickness can range between 0.1 mm to 0.7 mm. In some cases, substrate thickness can range between 0.3 mm to 0.6 mm. In some cases, the substrate has a wafer size of greater than or equal to one hundred (100) mm, greater than or equal to two hundred (200) mm, greater than or equal to three hundred (300) mm. In some cases, the substrate has panel dimension of greater than or equal to one hundred (100) mm, or greater than or equal to five hundred (500) mm, or greater than or equal to one thousand (1000) mm, or greater than or equal to three thousand (3000) mm. The aforementioned are example substrate configurations, and based upon the disclosure provided herein, one of ordinary skill in the art will recognize a variety of other substrate configurations that are possible in accordance with different embodiments.

Where TFTs are to be formed as electronic devices on the substrate, the substrate can include an alkali-free composition. In other cases, the substrate can also include an alkali-containing composition that may be, for example, suitable for ion exchange processing so long as the respective structure is compatible with the intended electronic structures to be fabricated thereon. High purity fused silica (HPFS) substrates are also possible. Processing of the substrate can be as a free-standing sheet, a substrate bonded temporarily to a carrier, or a web that is compatible with roll-to-roll processing. The substrate material can, for example, have a Young's modulus in the range of 60-90 GPa. The glass composition can, for example, have a strain point in the range of a 500-900 C. The substrate composition can, for example, have a thermal expansion coefficient in the range of 2-10 ppm/C. While the aforementioned examples discuss applications using specific substrate materials, other substrate materials are possible in accordance with other embodiments. For example, embodiments using high purity fused silica substrates are possible. Such high purity fused silica has a thermal expansion coefficient of about 0.5 ppm/C.

Figure 2A:
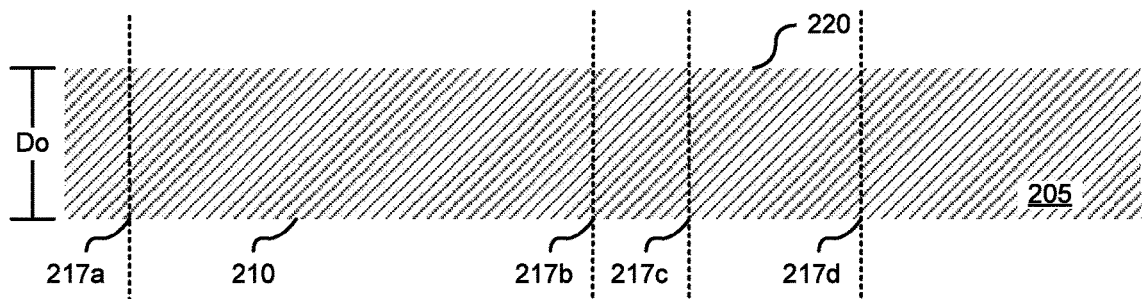
FIGS. 2a-2d show a subset of processing steps in accordance with one or more embodiments including partial formation of a via through a substrate, followed by formation of an electronic device on the substrate, and later completion of the partially formed via through the substrate.

Turning to FIG. 2a, a substrate 205 is shown that has a first surface 210, a second surface 220, and identified locations 217a, 217b, 217c, 217d where through-hole vias are desired. As shown, substrate 205 has a thickness Do.

Returning to FIG. 1, the substrate is etched at the identified locations to form partial vias at the identified locations on the first surface of the substrate (block 110). While the embodiment is generally discussed as relying on wet etching, any approach for opening a via in the substrate can be used including, but not limited to, plasma etching, laser ablation, and/or mechanical methods. As one example, the etching may be accomplished by covering surfaces of the substrate with an etch protective material, and patterning the etch protective material to expose the first surface of the substrate at the locations identified for through-hole vias. The substrate is then exposed to a wet etchant through the patterned openings causing the partial vias to form in the substrate. Based upon the disclosure provided herein, one of ordinary skill in the art will recognize a variety of etchants that may use used in relation to embodiments discussed herein including, but not limited to, hydrofluoric acid (HF), potassium hydroxide (KOH), and/or sodium hydroxide (NaOH).

Alternatively, where the substrate is a transparent substrate, the locations on the first surface of the substrate may be exposed to photonic energy from a laser light source. This exposure to the photonic energy changes at least one characteristic of the transparent substrate along defined paths extending from the first surface substantially into the transparent substrate, and in some cases all the way through to the second surface of the transparent substrate. In some embodiments, the laser light source is from a laser capable of quasi-non-diffracting drilling (e.g., Gauss-Bessel or Bessel beam drilling). In some cases, the characteristic of the transparent substrate that is changed by exposure to the laser light source is density caused by a melting of the substrate along the defined paths. In various cases, the characteristic of the material that is changed by exposure to the laser light source is refractive index, which may be changed with or without a density change. Such defined paths may be alternatively referred to as "damage tracks" extending into or through the transparent substrate. By changing, for example, the density of the material along a defined path from the first surface of the transparent substrate to a second surface of the transparent substrate, the transparent substrate along the defined paths is made more susceptible to etching relative to other areas of the substrate. In some cases, an etch ratio of 9:1 (i.e., a rate of etch of the defined path is nine times greater than the rate of etch for areas of the transparent substrate surrounding the defined paths) is achieved. As the transparent substrate is sufficiently transparent to allow photonic energy from the laser light source to pass either all the way through the substrate or substantially into the substrate, the change in characteristic of the transparent substrate along the defined paths extends substantially into the substrate. The substrate is then exposed to an etchant resulting in partial vias being opened along the damage tracks. Based upon the disclosure provided herein, one of ordinary skill in the art will recognize a variety of etchants that may use used in relation to embodiments discussed herein including, but not limited to, hydrofluoric acid (HF), potassium hydroxide (KOH), and/or sodium hydroxide (NaOH). In some cases, the second surface is covered with an etch protective layer while the substrate is exposed to the etchant.

The partial vias extend from only one surface of the substrate while the other surface of the substrate remains protected from any damage that would occur due to the etching process. In other cases, the partial vias extend from only one surface of the substrate and the other surface of the substrate (not protected) was exposed to the etching process but no partial vias form. This may result in a uniform etching of the second surface. Since the partial vias represent completion of a significant portion of a later completed through-hole via, the amount of processing time to convert a partial via to a through-hole via is significantly less than that required to open a through-hole via in a single process. The reduced processing time reduces the effect of, for example, etching on electronic devices formed between formation of the partial vias and later conversion of the partial vias to through-hole vias. The depth at which the partial vias extend into the substrate is selected in some cases based upon the desired reduction of the amount of etching time that the substrate including electronic devices is to be exposed where etching is to be used to convert partial vias to through-hole vias, or based upon the amount of laser ablation that is to be used to convert partial vias to through-hole vias. In some embodiments, the partial vias extend from the first surface of the substrate into the substrate to a depth between ten (10) percent of the thickness of the substrate (e.g., Do of FIG. 2a) and ninety-five (95) percent of the thickness of the substrate (e.g., Do of FIG. 2a). In some embodiments, the partial vias extend from the first surface of the substrate into the substrate to a depth between twenty (20) percent of the thickness of the substrate and ninety (90) percent of the thickness of the substrate. In some embodiments, the partial vias extend from the first surface of the substrate into the substrate to a depth between forty (40) percent of the thickness of the substrate and ninety (90) percent of the thickness of the substrate. In various instances, the partial vias extend from the first surface of the substrate into the substrate to a depth between fifty (50) percent of the thickness of the substrate and ninety (90) percent of the thickness of the substrate. In some instances, the partial vias extend from the first surface of the substrate into the substrate to a depth between sixty (60) percent of the thickness of the substrate and ninety (90) percent of the thickness of the substrate. In other instances, the partial vias extend from the first surface of the substrate into the substrate to a depth between seventy (70) percent of the thickness of the substrate and ninety (90) percent of the thickness of the substrate.

Figure 2B:
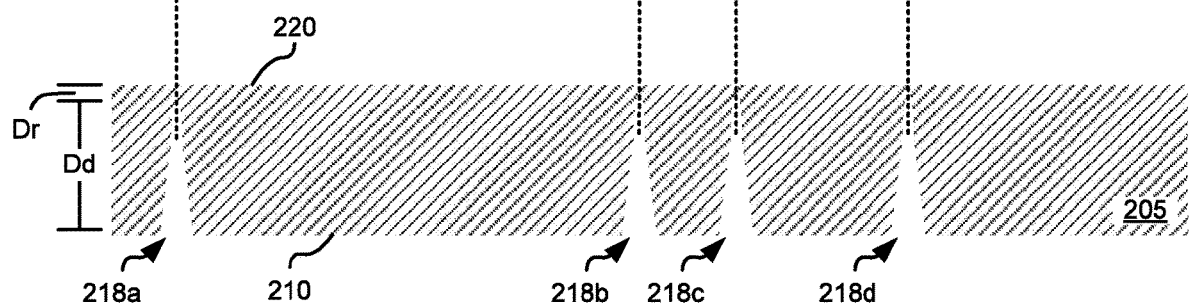

Turning to FIG. 2b, substrate 205 is shown after etching opens partial vias 218a, 218b, 218c, 218d to a depth Dd at locations 217a, 217b, 217c, 217d. Partial vias 218a, 218b, 218c, 218d only extend partially from first surface 210 to second surface 220 ending a remainder distance, Dr, from second surface 220. In various instances, Dd is between forty (40) percent and ninety-five (95) percent of Do (thus, Dr is between sixty (60) percent and five (5) percent of Do). In some embodiments Dd is between fifty (50) percent and ninety-five (95) percent of Do (thus, Dr is between fifty (50) percent and five (5) percent of Do). In various instances, Dd is between sixty (60) percent and ninety (90) percent of Do (thus, Dr is between forty (40) percent and ten (10) percent of Do). In other instances, Dd is between seventy (70) percent and ninety percent (90) of Do (thus, Dr is between thirty (30) percent and ten (10) percent of Do). Partial vias 218a, 218b, 218c, 218d can have tapered, vertical, or curved side walls. Although illustrated in FIG. 2b to be identical, the partial vias can vary in diameter and/or depth.

Returning to FIG. 1 and following flow diagram 100, in some embodiments the partial vias are filled or partially filled (block 113). This may be done to avoid contaminants lodging in the partial vias during later processes of, for example, forming electronic devices on the substrate. Where the partial vias are to be filled, they may be filled with a material that is readily removed or partially removed or partially removed without significant impact on later formed electronic devices or the partial vias may be filled with a metal or electrically conductive materials that will form part of an electrically conductive interconnect that will be finished in a subsequent metallization process carried out after the partial vias are completed to be through-hole vias extending from the first surface to the second surface. As an example, the partial vias may be filled with one or more of: a conductor, a polymer, and/or a sol-gel.

Electronic devices are formed on the second surface of the substrate (block 115). The electronic devices may be fully formed in this process or may be only partially formed. An integrated device, module, or system based upon the substrate can utilize through-hole via structures as an electrical, optical, fluidic, and/or mechanical element. Such electronic devices may, for example, form a TFT active matrix backplane for a display device formed on the substrate. As another example, such electronic devices may form a passive matrix backplane for a display device formed on the substrate, a micro-driver integrated circuit active matrix, or direct integrated circuit electrical connectivity. Electronic devices for other products beyond display products are also possible in accordance with embodiments discussed herein. Based upon the disclosure provided herein, one of ordinary skill in the art will recognize a variety of electronic devices (either fully or partially formed) that may be formed in relation to different embodiments. In addition, embodiments may also be used for non-electronic device applications such as optical, fluidic as examples. Electronic or non-electronic devices may also be formed or partially formed on the first surface of the substrate.

Figure 2C:
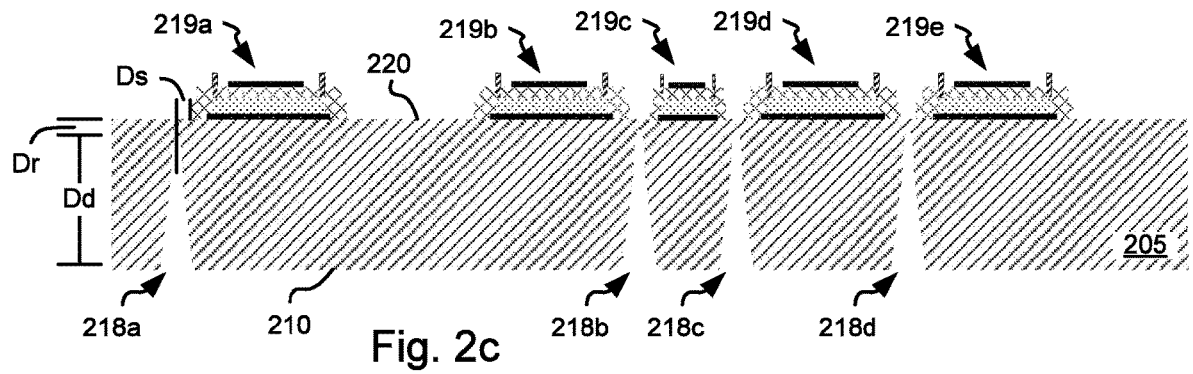

Turning to FIG. 2c, electronic devices 219a, 219b, 219c, 219d, 219e are shown formed on second surface 220 of substrate 205. Electronics devices 219 are spaced a distance (Ds) from the center of respective partially formed vias. Ds is measured from an outer edge of electronic device 219a to a center of partial via 218a. In some embodiments, Ds is less than five hundred (500) micrometers (μm). In various embodiments, Ds is less than two hundred (200) μm. In some embodiments, Ds is less than one hundred (100) μm. In various embodiments, Ds is less than fifty (50) μm. In some embodiments, Ds is less than twenty (20) μm. In various embodiments, Ds is less than ten (10) μm. Electronic devices 219 may be spaced differing distances Ds from partially formed vias.

In some cases, electronic devices 219 include microLEDs that are placed on or fabricated on the surface of the transparent substrate. A variety of microLED placement methods are possible such as transfer printing, laser transfer, and fluidic assembly. The microLEDs can be of a size with a linear dimension of less than two hundred micrometers (200 μm). In particular cases, the microLEDs can be of a size with a linear dimension of less than one hundred fifty micrometers (150 μm). In yet more particular cases, the microLEDs can be of a size with a linear dimension of less than one hundred (100) μm. In yet more particular cases, the microLEDs can be of a size with a linear dimension of less than fifty (50) μm. In yet more particular cases, the microLEDs can be of a size with a linear dimension of less than twenty (20) μm. In yet more particular cases, the microLEDs can be of a size with a linear dimension of less than ten (10) μm. The microLEDs can also be of similar structure and arrangement to produce a monochrome emission or they can emit at different wavelengths to produce a color display. In some embodiments, the microLEDs may be deposited on the substrate either before or after the vias have been fully formed.

Where the system is to be used in a microLED display, microLEDs may be placed or fabricated on one surface of substrate 205 along with fabricate thin film transistors or conductor lines, and the driver electronics are placed on or fabricated on the opposite side of substrate 205. The driver electronics can be located on separate circuit boards with only electrical contact to the opposite side of substrate or assembled onto the substrate surface directly. Such placement may be useful in enabling top emission microLEDs with either a minimal bezel and/or a tiled configuration. Conductive material (e.g., metal) interconnect may be formed through vias to provide electrical connection between the driver electronics on one side and the microLEDs on the opposite side. While some of the electronic devices discussed are specific to displays, application of the embodiments discussed herein is not limited to display technologies.

Since the electronic devices are at least partially formed after partial vias are in place, the electronic devices are not exposed to a substantial part of the through-hole via forming processes. For example, where partial vias 218a, 218b, 218c, 218d extend ninety (90) percent of the way through substrate 205, electronic devices 219a, 219b, 219c, 219d, 219e are only exposed to the etching process used to open partial vias 218a, 218b, 218c, 218d. If the electronic devices existed before the partial vias, the electronic devices would need to withstand the full via forming process. This avoids, for example, significant undercutting of electronic devices 219a, 219b, 219c, 219d, 219e during a wet etching process due to the isotropic nature of wet etching and the differential etch rates of materials. Further, where an etch protection layer is to be placed over electronic devices 219a, 219b, 219c, 219d, 219e during a later etch to convert partial vias 218a, 218b, 218c, 218d into through-hole vias, a broader choice of etch protection materials or thin layers of masking materials are possible since only a small portion of the ultimate through-hole via (i.e., the portion of substrate 205 corresponding to distance Dr) remains to be etched after formation of electronic devices 219a, 219b, 219c, 219d, 219e.

Returning to FIG. 1 and following flow diagram 100, the partial vias are finished to complete through-hole vias extending from the first surface to the second surface (block 120). This process may be done by any method capable of removing the portion of the substrate remaining between the partial vias and the second surface of the substrate including, but not limited to, wet etching, plasma etching, laser ablation, and/or mechanical methods. Processes used to convert the partial vias to through-hole vias may be the same as those used to open the partial vias or different from those used to open the partial vias. Since processes used to complete the through-hole via can be different than those used to form the corresponding partial via, the final via opening and sidewalls can be different. For example, the portion of the via formed at a later time in the process can have a surface opening diameter or shape, sidewall angle slope or shape, or sidewall roughness different than that of the original partial via. The resulting through-hole via can be asymmetric in shape as well as contain different fill materials. The asymmetry can be in the form of a tapered via with same or different slopes. It can also be a via with a waist diameter smaller than both surface openings. The asymmetry can include a waist either at the midpoint of the via or off-center closer to one surface compared to the other. The asymmetry can contain an inflection point in the sidewall slope. The via opening diameters on the first and second surface can the same or differ. In either case, examples of via opening diameters are between 10 um and 200 um, or between 20 um and 100 um, or between 20 um and 50 um. For example the via diameter on the second surface can be <100 um, <80 um, <50 um, <30 um, <20 um, or <10 um.

The ratio of the via diameter on the first to second surface can be >1:1, >2:1, >3:1, >5:1, >7:1, or >10:1. The ratio of the substrate thickness to the smallest via surface opening can be greater than 1:1, greater than 3:1, greater than 5:1, greater than 10:1, greater than 30:1, or greater than 50:1.

As a particular example, laser ablation may be used at the second surface of the via to remove a portion of the substrate to open a connection between the second surface of the substrate and a respective partial via. As another example, an etch protection material may be formed over the substrate leaving only the openings of partial vias at the first surface of the substrate an locations on the second surface of the substrate corresponding to the partial vias exposed. The substrate is then exposed to an etchant such as, for example, hydrofluoric acid (HF), potassium hydroxide (KOH), and/or sodium hydroxide (NaOH) that removes the remainder of the substrate between respective partial vias and the second surface of the substrate from both surfaces of the substrate. As yet another example, an etch protection material may be formed over the substrate leaving only the openings of partial vias at the first surface exposed. The substrate is then exposed to an etchant that removes the remainder of the substrate between respective partial vias and the second surface of the substrate from only the first surface of the substrate. As yet a further example, an etch protection material may be formed over the substrate leaving only locations on the second surface of the substrate corresponding to the partial vias exposed. The substrate is then exposed to an etchant that removes the remainder of the substrate between respective partial vias and the second surface of the substrate from only the second surface of the substrate. Based upon the disclosure provided herein, one of ordinary skill in the art will recognize a variety of processes that may be used in accordance with different embodiments for removing the remainder of the substrate to convert the partial vias to through-hole vias.

Figure 2D:
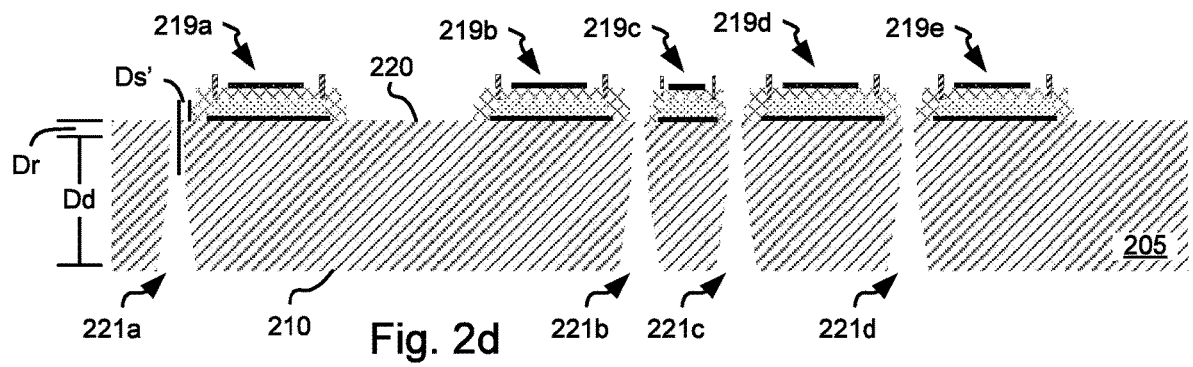

Turning to FIG. 2d, through-hole vias 221a, 221b, 221c, 221d are shown where the remainder of substrate 205 corresponding to partial vias 218a, 218b, 218c, 218d has been removed. Electronics devices 219 are spaced a distance (Ds') from the closest edge of through-hole vias 221a, 221b, 221c, 221d. Ds' is measured from an outer edge of electronic device 219a to a nearest edge of through-hole via 221a. In some embodiments, Ds' is less than five hundred (500) µm. In various embodiments, Ds' is less than two hundred (200) µm. In some embodiments, Ds' is less than one hundred (100) µm. In various embodiments, Ds' is less than fifty (50) µm. In some embodiments, Ds' is less than twenty (20) µm. In various embodiments, Ds' is less than ten (10) µm.

Where the vias are to be metalized, such metallization can be partially performed as discussed above in relation to the process of block 113, or can be metalized only after the partial vias are converted to through-hole vias. Either way, full metallization is only completed after at least a portion of an electronic device is formed on the substrate. As metallization can be performed after formation of the electronic devices is complete, conformal metallization methods can be used where the via is not fully filled with conductive material. As an example, partially formed vias can be partially metallized with a metal material before completion of the electronic device. After subsequent completion of the via process after the electronic device is formed, metallization of the opened electronic via can be completed by a conductive paste applied through the second surface opening.

Figure 3:
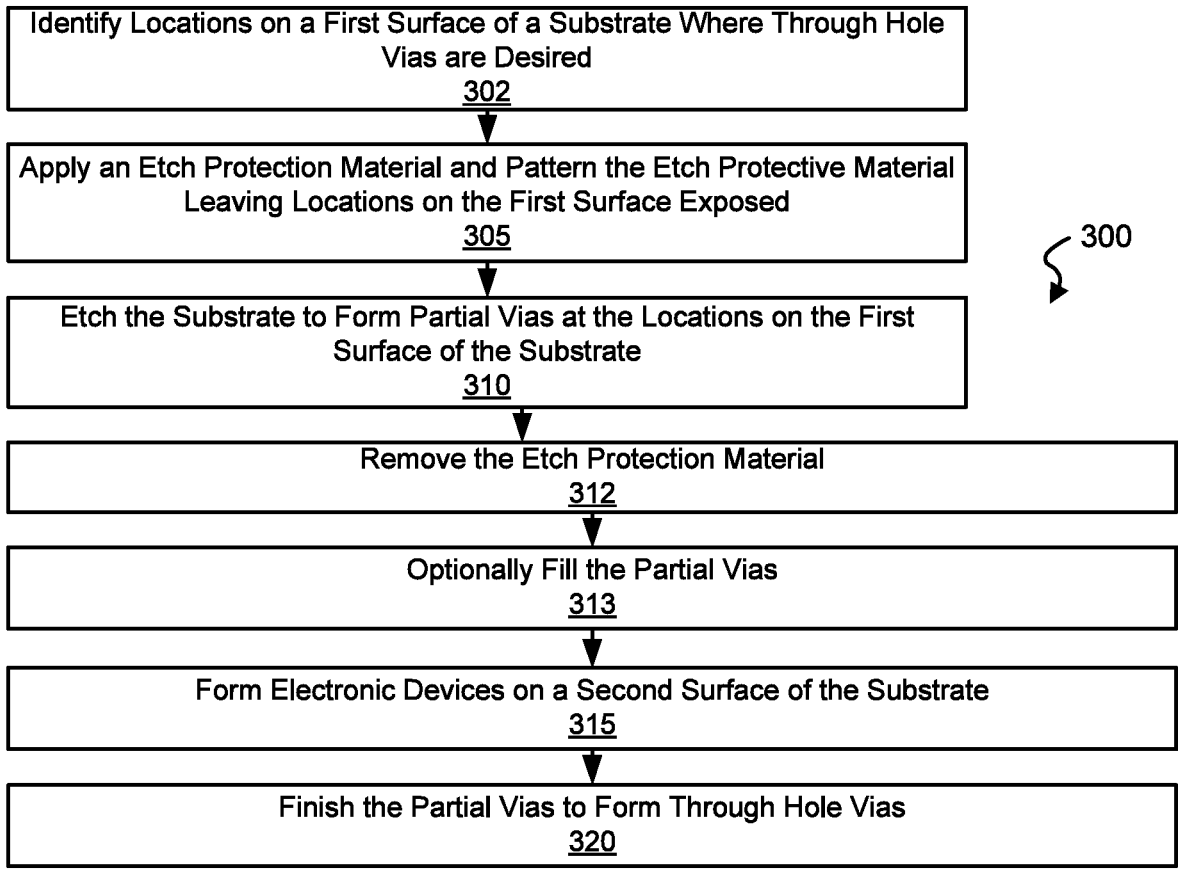
FIG. 3 is a flow diagram showing a method for manufacturing substrate systems in accordance with some embodiments that include partial etching of a via through a substrate followed by forming an electronic device on the substrate, and later completion of the partially formed via through the substrate.

Turning to FIG. 3, a flow diagram 300 shows a method for manufacturing substrate systems in accordance with some embodiments where partial vias are formed before at least part of an electronic device has been formed, and later the partial vias are converted to through-hole vias by removing portions of the substrate corresponding to respective locations of the partial vias after at least part of the electronic device has been formed. Following flow diagram 300, locations on a first surface of a substrate are identified where through-hole vias are desired (block 302). The substrate may be formed of any of a number of materials including, but not limited to, glass, glass-ceramic, ceramic, polymer, or a multi-layer composite of one or more of the aforementioned materials. In some cases, the substrate is a transparent substrate. As an example, the substrate can be a Corning® EAGLE XG®, Lotus™ NXT, or other alkaline earth boro-aluminosilicate substrate, high purity fused silica, or alkali-containing glass. In such cases, substrate thickness can range between 0.1 millimeter (mm) to 1.0 mm. In various cases, substrate thickness can range between 0.1 mm to 0.7 mm. In some cases, the substrate has a wafer size of greater than or equal to one hundred (100) mm, greater than or equal to two hundred (200) mm, greater than or equal to three hundred (300) mm. In some cases, the substrate has panel dimension of greater than or equal to one hundred (100) mm, or greater than or equal to five hundred (500) mm, or greater than or equal to one thousand (1000) mm, or greater than or equal to three thousand (3000) mm. The aforementioned are example substrate configurations, and based upon the disclosure provided herein, one of ordinary skill in the art will recognize a variety of other substrate configurations that are possible in accordance with different embodiments.

Figure 4A:
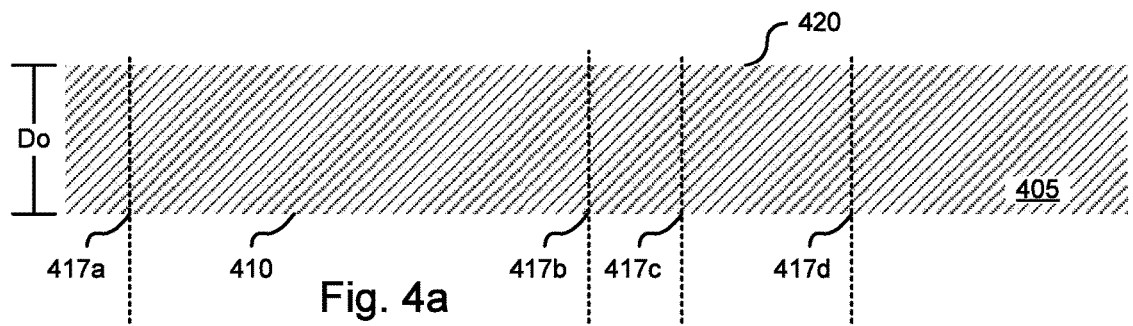
FIGS. 4a-4f show a subset of processing steps in accordance with one or more embodiments including partial formation of a via through a substrate using an etch protection material patterned to define via locations, followed by formation of an electronic device on the substrate, and later completion of the partially formed via through the substrate.

Turning to FIG. 4a, a substrate 405 is shown that has a first surface 410, a second surface 420, and identified locations 417a, 417b, 417c, 417d where through-hole vias are desired. As shown, substrate 405 has a thickness Do.

Figure 4B:
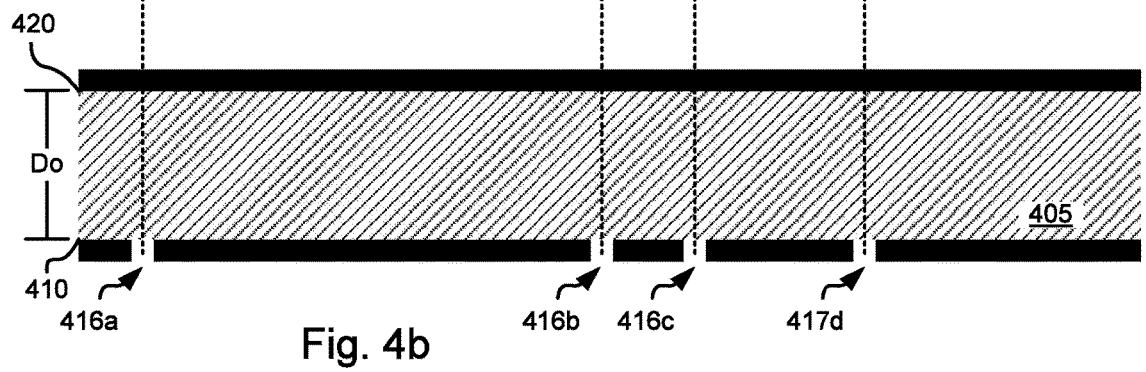

Returning to FIG. 3 and following flow diagram 300, an etch protection material is formed over both the first surface and the second surface of the substrate, and the etch protection material is patterned to expose locations on the first surface of the substrate corresponding to the desired locations of through-hole vias (block 305). Turning to FIG. 4b, substrate 405 is shown with an etch protection material formed over second surface 420 and over first surface 410. The etch protection material is patterned leaving openings 416a, 416b, 416c, 416d that correspond to identified locations 417a, 417b, 417c, 417d, respectively.

Returning to FIG. 3 and following flow diagram 300, the substrate is exposed to a wet etchant through the patterned openings in the etch protection material that expose the first surface at locations corresponding to the respective identified locations (block 310). This etching is continued long enough to form partial vias extending into the substrate. The substrate is exposed to a wet etchant through the patterned openings causing the partial vias to form in the substrate. Based upon the disclosure provided herein, one of ordinary skill in the art will recognize a variety of etchants that may use used in relation to embodiments discussed herein including, but not limited to, hydrofluoric acid (HF), potassium hydroxide (KOH), and/or sodium hydroxide (NaOH). The wet etchant process may follow a previous laser exposure process. Instead of a wet etch process, and alternative example is to expose the substrate to a plasma etch process.

The partial vias extend from only one surface of the substrate while the other surface of the substrate remains protected from any damage that would occur due to the etching process. Since the partial vias represent completion of a significant portion of a later completed through-hole via, the amount of processing time to convert a partial via to a through-hole via is significantly less than that required to open a through-hole via in a single process. The reduced processing time reduces the effect of, for example, etching on electronic devices formed between formation of the partial vias and later conversion of the partial vias to through-hole vias. The depth at which the partial vias extend into the substrate is selected in some cases based upon the desired reduction of the amount of etching time that the substrate including electronic devices is to be exposed where etching is to be used to convert partial vias to through-hole vias, or based upon the amount of laser ablation that is to be used to convert partial vias to through-hole vias. In some embodiments, the partial vias extend from the first surface of the substrate into the substrate to a depth between ten (10) percent of the thickness of the substrate (e.g., Do of FIG. 4a) and ninety-five (95) percent of the thickness of the substrate (e.g., Do of FIG. 4a). In some embodiments, the partial vias extend from the first surface of the substrate into the substrate to a depth between twenty (20) percent of the thickness of the substrate and ninety (90) percent of the thickness of the substrate. In some embodiments, the partial vias extend from the first surface of the substrate into the substrate to a depth between forty (40) percent of the thickness of the substrate and ninety (90) percent of the thickness of the substrate. In various instances, the partial vias extend from the first surface of the substrate into the substrate to a depth between fifty (50) percent of the thickness of the substrate and ninety (90) percent of the thickness of the substrate. In some instances, the partial vias extend from the first surface of the substrate into the substrate to a depth between sixty (60) percent of the thickness of the substrate and ninety (90) percent of the thickness of the substrate. In other instances, the partial vias extend from the first surface of the substrate into the substrate to a depth between seventy (70) percent of the thickness of the substrate and ninety (90) percent of the thickness of the substrate.

Figure 4C:
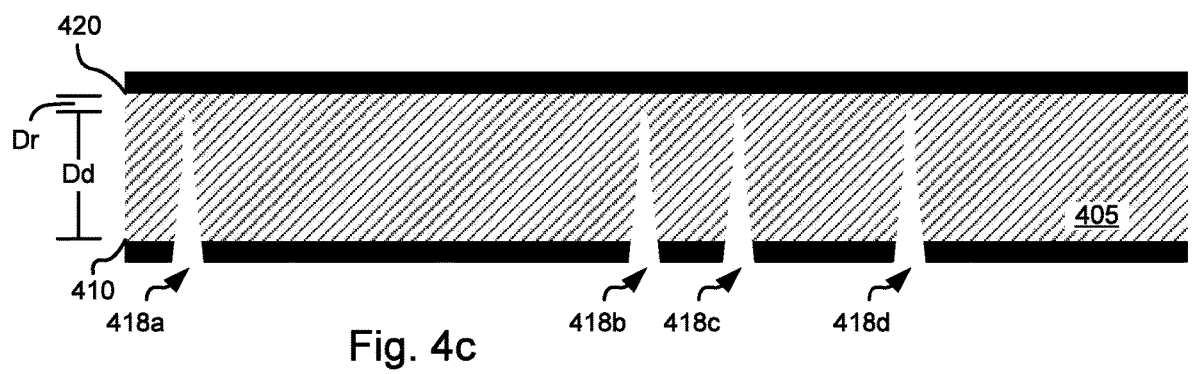

Turning to FIG. 4c, substrate 405 is shown after etching opens partial vias 418a, 418b, 418c, 418d to a depth Dd at locations 417a, 417b, 417c, 417d. Partial vias 418a, 418b, 418c, 418d only extend partially from first surface 410 to second surface 420 ending a remainder distance, Dr, from second surface 420. In various instances, Dd is between forty (40) percent and ninety-five (95) percent of Do (thus, Dr is between sixty (60) percent and five (5) percent of Do). In some embodiments Dd is between fifty (50) percent and ninety-five (95) percent of Do (thus, Dr is between fifty (50) percent and five (5) percent of Do). In various instances, Dd is between sixty (60) percent and ninety (90) percent of Do (thus, Dr is between forty (40) percent and ten (10) percent of Do). In other instances, Dd is between seventy (70) percent and ninety percent (90) of Do (thus, Dr is between thirty (30) percent and ten (10) percent of Do). Partial vias 418a, 418b, 418c, 418d can have tapered, vertical, or curved side walls. Although illustrated in FIG. 4c to be identical, the partial vias can vary in diameter and depth.

Figure 4D:
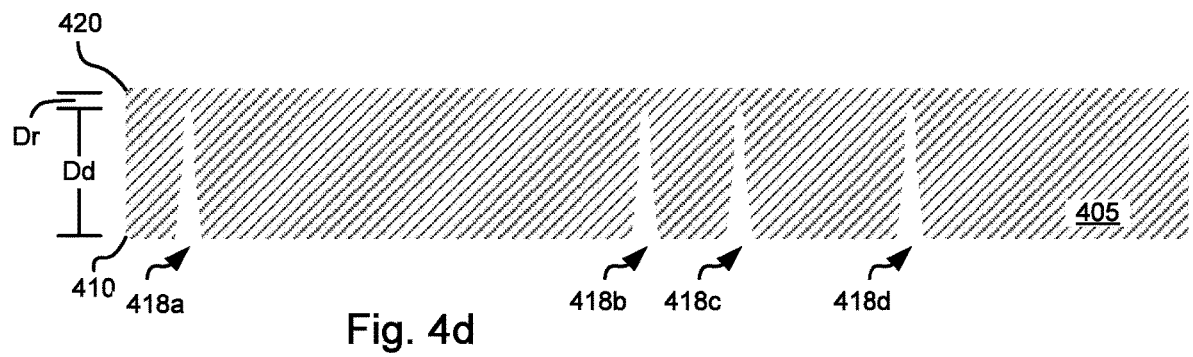

Returning to FIG. 3 and following flow diagram 300, the etch protection material is removed leaving the substrate with partial vias extending therein (block 312). Turning to FIG. 4d, substrate 405 is shown after removal of the etch protection material from first surface 410 and second surface 420.

Returning to FIG. 3 and following flow diagram 300, in some embodiments the partial vias are filled (block 313) or partially filled. This may be done to avoid contaminants lodging in the partial vias during later processes of, for example, forming electronic devices on the substrate. Where the partial vias are to be filled, they may be filled with a material that is readily removed or partially removed without significant impact on later formed electronic devices or the partial vias may be filled with a metal or other conductor that will form part of an electrically conductive interconnect that will be finished in a subsequent metallization process carried out after the partial vias are completed to be through-hole vias extending from the first surface to the second surface. As an example, the partial vias may be filled with one or more of: a conductor, a polymer, and/or a sol-gel.

Electronic devices are formed on the second surface of the substrate (block 315). The electronic devices may be fully formed in this process or may be only partially formed. An integrated device, module, or system based upon the substrate can utilize through-hole via structures as an electrical, optical, fluidic, and/or mechanical element. Such electronic devices may, for example, form a TFT active matrix backplane for a display device formed on the substrate. As another example, such electronic devices may form a passive matrix backplane for a display device formed on the substrate, a micro-driver integrated circuit active matrix, or direct integrated circuit electrical connectivity. Electronic devices for other products beyond display products are also possible in accordance with embodiments discussed herein. Based upon the disclosure provided herein, one of ordinary skill in the art will recognize a variety of electronic devices (either fully or partially formed) that may be formed in relation to different embodiments. In addition, embodiments may also be used for non-electronic device applications such as optical, fluidic as examples. Electronic or non-electronic devices may also be formed or partially formed on the first surface of the substrate.

Figure 4E:
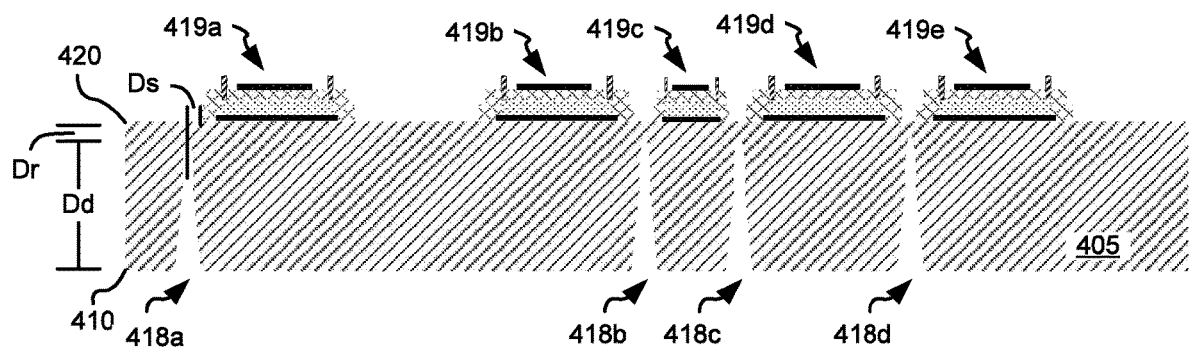

Turning to FIG. 4e, electronic devices 419a, 419b, 419c, 419d, 419e are shown formed on second surface 420 of substrate 405. Electronics devices 419 are spaced a distance (Ds) from the center of respective partially formed vias. Ds is measured from an outer edge of electronic device 419a to a center of partial via 418a. In some embodiments, Ds is less than five hundred (500) µm. In various embodiments, Ds is less than two hundred (200) µm. In some embodiments, Ds is less than one hundred (100) µm. In various embodiments, Ds is less than fifty (50) µm. In some embodiments, Ds is less than twenty (20) µm. In various embodiments, Ds is less than ten (10) µm. Electronic devices may be spaced differing distances Ds from partially formed vias.

Since the electronic devices are at least partially formed after partial vias are in place, the electronic devices are not exposed to a substantial part of the through-hole via forming processes. For example, where partial vias 418a, 418b, 418c, 418d extend ninety (90) percent of the way through substrate 405, electronic devices 419a, 419b, 419c, 419d, 419e are only exposed to the etching process used to open the remaining partial vias 418a, 418b, 418c, 418d. This avoids, for example, significant undercutting of electronic devices 419a, 419b, 419c, 419d, 419e during a wet etching process due to the isotropic nature of wet etching and the differential etch rates of materials. Further, where an etch protection layer is to be placed over electronic devices 419a, 419b, 419c, 419d, 419e during a later etch to convert partial vias 418a, 418b, 418c, 418d into through-hole vias, a broader choice of etch protection materials or thin layers of masking materials are possible since only a small portion of the ultimate through-hole via (i.e., the portion of substrate 405 corresponding to distance Dr) remains to be etched after formation of electronic devices 419a, 419b, 419c, 419d, 419e.

Returning to FIG. 3 and following flow diagram 300, the partial vias are finished to complete through-hole vias extending from the first surface to the second surface (block 320). This process may be done by any method capable of removing the portion of the substrate remaining between the partial vias and the second surface of the substrate including, but not limited to, wet etching, plasma etching, laser ablation, and/or mechanical methods. Processes used to convert the partial vias to through-hole vias may be the same as those used to open the partial vias or different from those used to open the partial vias. Since processes used to complete the through-hole via can be different than those used to form the corresponding partial via, the final via opening and sidewalls can be different. For example, the portion of the via formed at a later time in the process can have a surface opening diameter or shape, sidewall angle slope or shape, or sidewall roughness than that of the original partial via. The resulting through-hole via can be asymmetric in shape as well as contain different fill materials. The asymmetry can be in the form of a tapered via with same or different slopes. It can also be a via with a waist diameter smaller than both surface openings. The asymmetry can include a waist either at the midpoint of the via or off-center closer to one surface compared to the other. The asymmetry can contain an inflection point in the sidewall slope. In addition to the via asymmetry vertically in the substrate going from the first surface to the second surface, there may also be a lateral misalignment or radial asymmetry. For example, the via formed at the second surface may not be laterally aligned with the underlying via structure partially formed at the first surface. The may be aligned enough so that the resulting opening is completely through the substrate, but the resulting fully through via may not be radially symmetric. For example, in some instances, the via at the first surface and via at the second surface may have their center locations offset by between 0.1 µm and one hundred (100) µm. In various instances, the via at the first surface and via at the second surface may have their center locations offset by between 0.5 µm and fifty (50) µm. In some instances, the via at the first surface and via at the second surface may have their center locations offset by between one (1) µm and thirty (30) µm. In various instances, the via at the first surface and via at the second surface may have their center locations offset by between one (1) µm and twenty (20) µm. In some instances, the via at the first surface and via at the second surface may have their center locations offset by between one (1) µm and ten (10) µm. In various instances, the via at the first surface and via at the second surface may have their center locations offset by between one (1) µm and five (5) µm. In some instances, the via at the first surface and via at the second surface may have their center locations offset by between one (1) µm and three (3) µm.

Figure 14:
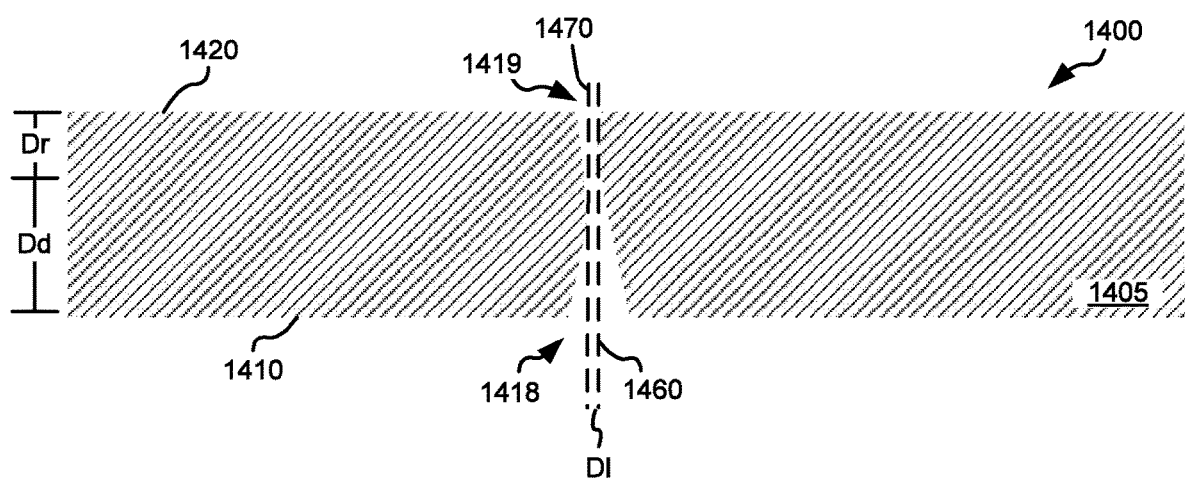
FIG. 14 shows a lateral offset between a center line of a partial via and a center line of a portion of a substrate removed to convert the partial via to a full via that can occur in relation to various embodiments.

Turning to FIG. 14, a graphic 1400 shows a substrate having an initially formed partial via 1418 extending a distance Dd into a substrate 1405 from a first surface 1410 of substrate 1405, and a portion 1419 of substrate 1405 removed from a second surface 1420 of substrate 1405 to convert partial via 1418 to a full via. Partial via 1418 is centered around a center line 1460, and portion 1419 is centered around a center line 1470. Center line 1460 is laterally offset by a distance Dl measured parallel to either first surface 1410 or second surface 1420.

As a particular example, laser ablation may be used at the second surface of the via to remove a portion of the substrate to open a connection between the second surface of the substrate and a respective partial via. As another example, an etch protection material may be formed over the substrate leaving only the openings of partial vias at the first surface of the substrate an locations on the second surface of the substrate corresponding to the partial vias exposed. The substrate is then exposed to an etchant such as, for example, hydrofluoric acid (HF), potassium hydroxide (KOH), and/or sodium hydroxide (NaOH) that removes the remainder of the substrate between respective partial vias and the second surface of the substrate from both surfaces of the substrate. As yet another example, an etch protection material may be formed over the substrate leaving only the openings of partial vias at the first surface exposed. The substrate is then exposed to an etchant that removes the remainder of the substrate between respective partial vias and the second surface of the substrate from only the first surface of the substrate. As yet a further example, an etch protection material may be formed over the substrate leaving only locations on the second surface of the substrate corresponding to the partial vias exposed. The substrate is then exposed to an etchant that removes the remainder of the substrate between respective partial vias and the second surface of the substrate from only the second surface of the substrate. Based upon the disclosure provided herein, one of ordinary skill in the art will recognize a variety of processes that may be used in accordance with different embodiments for removing the remainder of the substrate to convert the partial vias to through-hole vias.

Figure 4F:
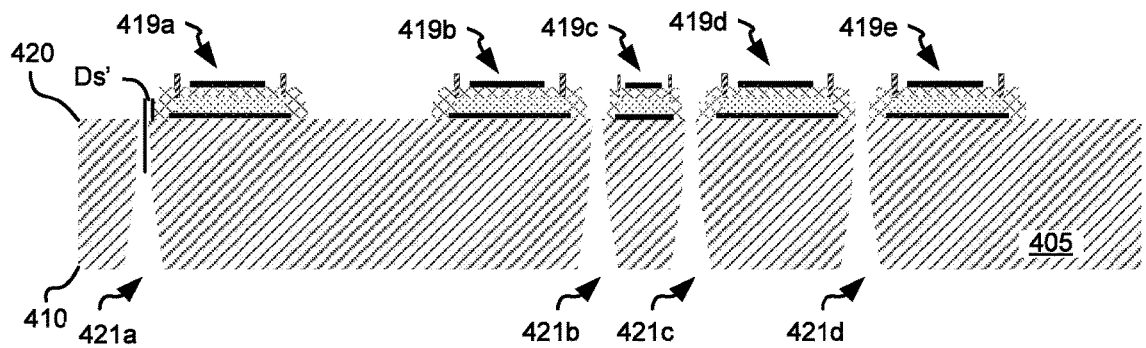

Turning to FIG. 4f, through-hole vias 421a, 421b, 421c, 421d are shown where the remainder of substrate 405 corresponding to partial vias 418a, 418b, 418c, 418d has been removed. Electronics devices 419 are spaced a distance (Ds') from the closest edge of through-hole vias 421a, 421b, 421c, 421d. Ds' is measured from an outer edge of electronic device 419a to a nearest edge of through-hole via 421a. In some embodiments, Ds' is less than five hundred (500) µm. In various embodiments, Ds' is less than two hundred (200) µm. In some embodiments, Ds' is less than one hundred (100) µm. In various embodiments, Ds' is less than fifty (50) µm. In some embodiments, Ds' is less than twenty (20) µm. In various embodiments, Ds' is less than ten (10) µm.

Where the vias are to be metalized, such metallization can be partially performed as discussed above in relation to the process of block 313, or can be metalized only after the partial vias are converted to through-hole vias. Either way, full metallization is only completed after at least a portion of an electronic device is formed on the substrate. As metallization can be performed after formation of the electronic devices is complete, conformal metallization methods can be used where the via is not fully filled with conductive material. As an example, partially formed vias can be partially metallized with a metal material before completion of the electronic device. After subsequent completion of the via process after the electronic device is formed, metallization of the opened electronic via can be completed by a conductive paste applied through the second surface opening.

Figure 5:
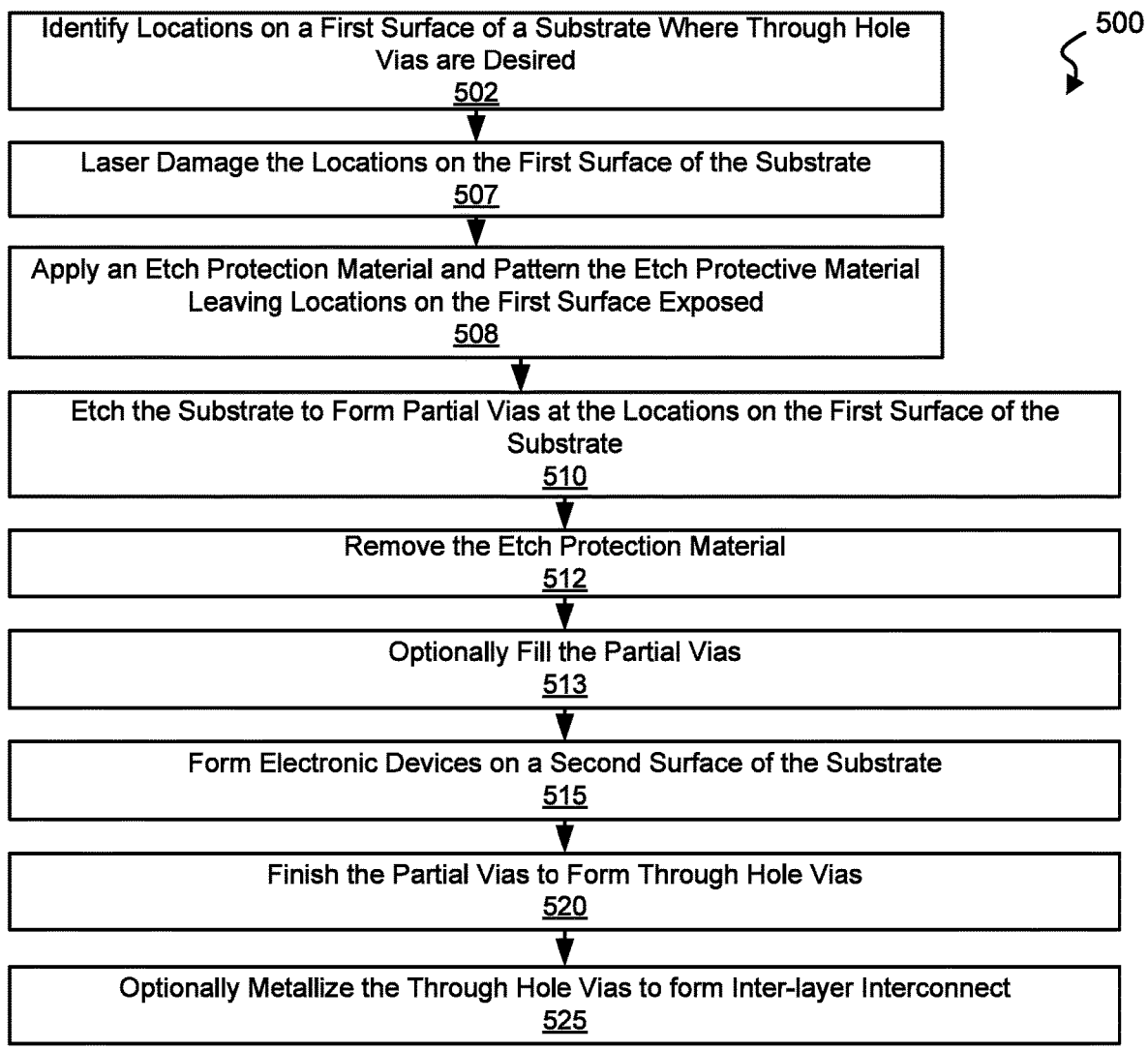
FIG. 5 is a flow diagram showing a method for manufacturing substrate systems in accordance with some embodiments that include partial etching of a via through a substrate using laser damage and an etch protection material, followed by forming an electronic device on the substrate, and later completion of the partially formed via through the substrate.

Turning to FIG. 5, a flow diagram 500 shows a method for manufacturing substrate systems in accordance with some embodiments where partial vias are formed before at least part of an electronic device has been formed, and later the partial vias are converted to through-hole vias by removing portions of the substrate corresponding to respective locations of the partial vias after at least part of the electronic device has been formed. Following flow diagram 500, locations on a first surface of a substrate are identified where through-hole vias are desired (block 502). The substrate may be formed of any of a number of materials including, but not limited to, glass, glass-ceramic, ceramic, polymer, or a multi-layer composite of one or more of the aforementioned materials. In some cases, the substrate is a transparent substrate. As an example, the substrate can be a Corning® EAGLE XG®, Lotus™ NXT, or other alkaline earth boro-aluminosilicate substrate, high purity fused silica, or alkali-containing glass. In such cases, substrate thickness can range between 0.1 millimeter (mm) to 1.0 mm. In various cases, substrate thickness can range between 0.1 mm to 0.7 mm. In some cases, substrate thickness can range between 0.3 mm to 0.6 mm. In some cases, the substrate has a wafer size of greater than or equal to one hundred (100) mm, greater than or equal to two hundred (200) mm, greater than or equal to three hundred (300) mm. In some cases, the substrate has panel dimension of greater than or equal to one hundred (100) mm, or greater than or equal to five hundred (500) mm, or greater than or equal to one thousand (1000) mm, or greater than or equal to three thousand (3000) mm. The aforementioned are example substrate configurations, and based upon the disclosure provided herein, one of ordinary skill in the art will recognize a variety of other substrate configurations that are possible in accordance with different embodiments.

Figure 6A:
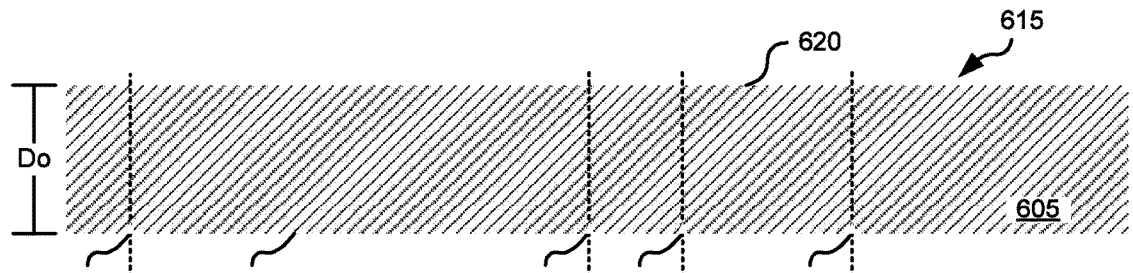
FIGS. 6a-6f show a subset of processing steps in accordance with one or more embodiments including partial formation of a via through a substrate using laser damage and an etch protection material patterned to define via locations, followed by formation of an electronic device on the substrate, and later completion of the partially formed via through the substrate.

Turning to FIG. 6a, a substrate 605 is shown that has a first surface 610, a second surface 620, and identified locations 617a, 617b, 617c, 617d where through-hole vias are desired. As shown, substrate 605 has a thickness Do.

Returning to FIG. 5 and following flow diagram 500, the substrate is exposed to photonic energy from a laser light source at the identified locations where through-hole vias are desired (block 507). This exposure to the photonic energy changes at least one characteristic of the transparent substrate along defined paths extending from the first surface of the transparent substrate to the second surface of the transparent substrate. In some embodiments, the laser light source is from a laser capable of quasi-non-diffracting drilling (e.g., Gauss-Bessel or Bessel beam drilling). In some cases, the characteristic of the transparent substrate that is changed by exposure to the laser light source is density caused by a melting of the substrate along the defined paths. In various cases, the characteristic of the material that is changed by exposure to the laser light source is refractive index, which may be changed with or without a density change. Such defined paths may be alternatively referred to as "damage tracks" extending through the transparent substrate. By changing, for example, the density of the material along a defined path from the first surface of the transparent substrate to a second surface of the transparent substrate, the transparent substrate along the defined paths is made more susceptible to etching relative to other areas of the substrate. In some cases, an etch ratio of 9:1 (i.e., a rate of etch of the defined path is nine times greater than the rate of etch for areas of the transparent substrate surrounding the defined paths) is achieved. As the transparent substrate is sufficiently transparent to allow photonic energy from the laser light source to pass through, the change in characteristic of the transparent substrate along the defined paths is substantially uniform from the first surface to the second surface of the transparent substrate. In some cases, the aforementioned defined paths are compatible with thermal cycles and process conditions used for fabricating electronic devices disposed over the transparent substrate. In particular cases, to be compatible with both LTPS and oxide TFT fabrication, some embodiments can combine via pre-definition with a low-compaction transparent substrate such as Lotus NXT. Based upon the disclosure provided herein, one of ordinary skill in the art will recognize other materials from which the transparent substrate may be formed that will provide compatibility between forming the predefined paths and later electronic device formation.

Figure 6B:
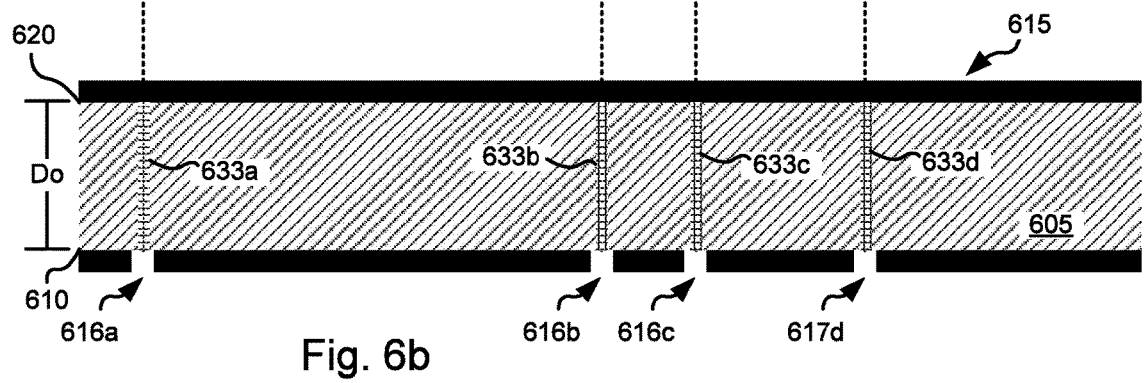

An etch protection material is formed over both the first surface and the second surface of the substrate, and the etch protection material is patterned to expose locations on the first surface of the substrate corresponding to the desired locations of through-hole vias (block 508). Turning to FIG. 6b, substrate 605 is shown with an etch protection material formed over second surface 620 and over first surface 610. The etch protection material is patterned leaving openings 616a, 616b, 616c, 616d that correspond to identified locations 617a, 617b, 617c, 617d, respectively. Damage tracks 633a, 633b, 633c, 633d extend into and/or through substrate 605 at the locations that were exposed to the photonic energy.

Returning to FIG. 5 and following flow diagram 500, the substrate is exposed to a wet etchant through the patterned openings in the etch protection material that expose the first surface at locations corresponding to the respective identified locations (block 510). This etching is continued long enough to form partial vias extending into the substrate. The substrate is exposed to a wet etchant through the patterned openings causing the partial vias to form in the substrate. Based upon the disclosure provided herein, one of ordinary skill in the art will recognize a variety of etchants that may use used in relation to embodiments discussed herein including, but not limited to, hydrofluoric acid (HF), potassium hydroxide (KOH), and/or sodium hydroxide (NaOH). The wet etchant process may follow a previous laser exposure process. Instead of a wet etch process, and alternative example is to expose the substrate to a plasma etch process.

The partial vias extend from only one surface of the substrate while the other surface of the substrate remains protected from any damage that would occur due to the etching process. Since the partial vias represent completion of a significant portion of a later completed through-hole via, the amount of processing time to convert a partial via to a through-hole via is significantly less than that required to open a through-hole via in a single process. The reduced processing time reduces the effect of, for example, etching on electronic devices formed between formation of the partial vias and later conversion of the partial vias to through-hole vias. The depth at which the partial vias extend into the substrate is selected in some cases based upon the desired reduction of the amount of etching time that the substrate including electronic devices is to be exposed where etching is to be used to convert partial vias to through-hole vias, or based upon the amount of laser ablation that is to be used to convert partial vias to through-hole vias. In some embodiments, the partial vias extend from the first surface of the substrate into the substrate to a depth between ten (10) percent of the thickness of the substrate (e.g., Do of FIG. 6a) and ninety-five (95) percent of the thickness of the substrate (e.g., Do of FIG. 6a). In some embodiments, the partial vias extend from the first surface of the substrate into the substrate to a depth between twenty (20) percent of the thickness of the substrate and ninety (90) percent of the thickness of the substrate. In some embodiments, the partial vias extend from the first surface of the substrate into the substrate to a depth between forty (40) percent of the thickness of the substrate and ninety (90) percent of the thickness of the substrate. In various instances, the partial vias extend from the first surface of the substrate into the substrate to a depth between fifty (50) percent of the thickness of the substrate and ninety (90) percent of the thickness of the substrate. In some instances, the partial vias extend from the first surface of the substrate into the substrate to a depth between sixty (60) percent of the thickness of the substrate and ninety (90) percent of the thickness of the substrate. In other instances, the partial vias extend from the first surface of the substrate into the substrate to a depth between seventy (70) percent of the thickness of the substrate and ninety (90) percent of the thickness of the substrate.

Figure 6C:
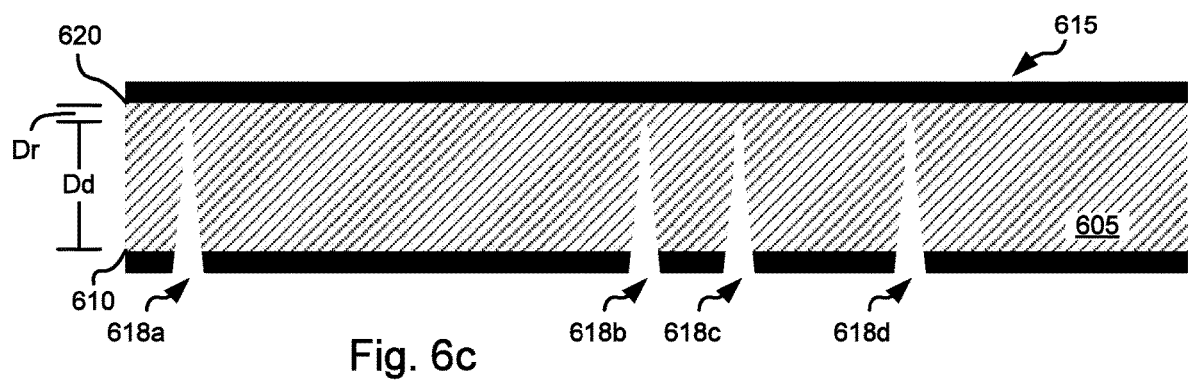

Turning to FIG. 6c, substrate 605 is shown after etching opens partial vias 618a, 618b, 618c, 618d to a depth Dd at locations 617a, 617b, 617c, 617d. Partial vias 618a, 618b, 618c, 618d only extend partially from first surface 610 to second surface 620 ending a remainder distance, Dr, from second surface 620. In various instances, Dd is between forty (40) percent and ninety-five (95) percent of Do (thus, Dr is between sixty (60) percent and five (5) percent of Do). In some embodiments Dd is between fifty (50) percent and ninety-five (95) percent of Do (thus, Dr is between fifty (50) percent and five (5) percent of Do). In various instances, Dd is between sixty (60) percent and ninety (90) percent of Do (thus, Dr is between forty (40) percent and ten (10) percent of Do). In other instances, Dd is between seventy (70) percent and ninety percent (90) of Do (thus, Dr is between thirty (30) percent and ten (10) percent of Do). Partial vias 618a, 618b, 618c, 618d can have tapered, vertical, or curved side walls. Although illustrated in FIG. 6c to be identical, the partial vias can vary in diameter and depth.

Figure 6D:
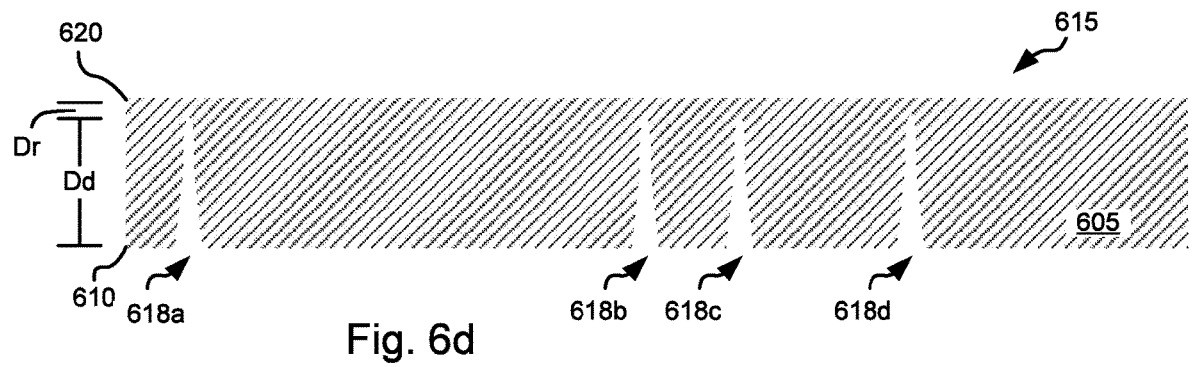

Returning to FIG. 5 and following flow diagram 500, the etch protection material is removed leaving the substrate with partial vias extending therein (block 512). Turning to FIG. 6d, substrate 605 is shown after removal of the etch protection material from first surface 610 and second surface 620.

Returning to FIG. 5 and following flow diagram 500, in some embodiments the partial vias are filled (block 513) or partially filled. This may be done to avoid contaminants lodging in the partial vias during later processes of, for example, forming electronic devices on the substrate. Where the partial vias are to be filled, they may be filled with a material that is readily removed or partially removed without significant impact on later formed electronic devices or the partial vias may be filled with a metal or other conductor that will form part of an electrically conductive interconnect that will be finished in a subsequent metallization process carried out after the partial vias are completed to be through-hole vias extending from the first surface to the second surface. As an example, the partial vias may be filled with one or more of: a conductor, a polymer, and/or a sol-gel.

Electronic devices are formed on the second surface of the substrate (block 515). The electronic devices may be fully formed in this process or may be only partially formed. An integrated device, module, or system based upon the substrate can utilize through-hole via structures as an electrical, optical, fluidic, and/or mechanical element. Such electronic devices may, for example, form a TFT active matrix backplane for a display device formed on the substrate. As another example, such electronic devices may form a passive matrix backplane for a display device formed on the substrate, a micro-driver integrated circuit active matrix, or direct integrated circuit electrical connectivity. Electronic devices for other products beyond display products are also possible in accordance with embodiments discussed herein. Based upon the disclosure provided herein, one of ordinary skill in the art will recognize a variety of electronic devices (either fully or partially formed) that may be formed in relation to different embodiments. In addition, embodiments may also be used for non-electronic device applications such as optical, fluidic as examples. Electronic or non-electronic devices may also be formed or partially formed on the first surface of the substrate.

Figure 6E:
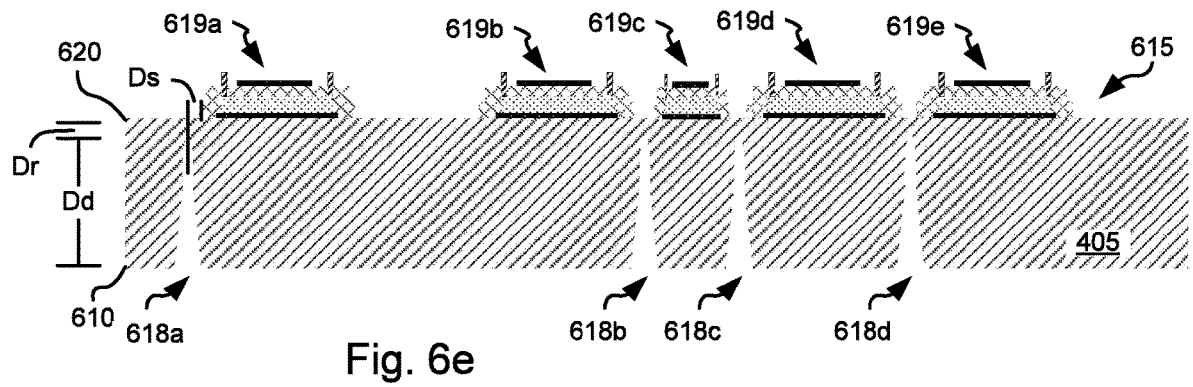

Turning to FIG. 6e, electronic devices 619a, 619b, 619c, 619d, 619e are shown formed on second surface 620 of substrate 605. Electronics devices 619 are spaced a distance (Ds) from the center of respective partially formed vias. Ds is measured from an outer edge of electronic device 619a to a center of partial via 618a. In some embodiments, Ds is less than five hundred (500) µm. In various embodiments, Ds is less than two hundred (200) µm. In some embodiments, Ds is less than one hundred (100) µm. In various embodiments, Ds is less than fifty (50) µm. In some embodiments, Ds is less than twenty (20) µm. In various embodiments, Ds is less than ten (10) µm. Electronic devices may be spaced differing distances Ds from partially formed vias.

Since the electronic devices are at least partially formed after partial vias are in place, the electronic devices are not exposed to a substantial part of the through-hole via forming processes. For example, where partial vias 618a, 618b, 618c, 618d extend ninety (90) percent of the way through substrate 605, electronic devices 619a, 619b, 619c, 619d, 619e are only exposed to the etching process used to open the remaining partial vias 618a, 618b, 618c, 618d. This avoids, for example, significant undercutting of electronic devices 619a, 619b, 619c, 619d, 619e during a wet etching process due to the isotropic nature of wet etching and the differential etch rates of materials. Further, where an etch protection layer is to be placed over electronic devices 619a, 619b, 619c, 619d, 619e during a later etch to convert partial vias 618a, 618b, 618c, 618d into through-hole vias, a broader choice of etch protection materials or thin layers of masking materials are possible since only a small portion of the ultimate through-hole via (i.e., the portion of substrate 605 corresponding to distance Dr) remains to be etched after formation of electronic devices 619a, 619b, 619c, 619d, 619e.

Returning to FIG. 5 and following flow diagram 500, the partial vias are finished to complete through-hole vias extending from the first surface to the second surface (block 520). This process may be done by any method capable of removing the portion of the substrate remaining between the partial vias and the second surface of the substrate including, but not limited to, wet etching, plasma etching, laser ablation, and/or mechanical methods. Processes used to convert the partial vias to through-hole vias may be the same as those used to open the partial vias or different from those used to open the partial vias. Since processes used to complete the through-hole via can be different than those used to form the corresponding partial via, the final via opening and sidewalls can be different. For example, the portion of the via formed at a later time in the process can have a surface opening diameter or shape, sidewall angle slope or shape, or sidewall roughness than that of the original partial via. The resulting through-hole via can be asymmetric in shape as well as contain different fill materials. The asymmetry can be in the form of a tapered via with same or different slopes. It can also be a via with a waist diameter smaller than both surface openings. The asymmetry can include a waist either at the midpoint of the via or off-center closer to one surface compared to the other. The asymmetry can contain an inflection point in the sidewall slope. In addition to the via asymmetry vertically in the substrate going from the first surface to the second surface, there may also be a lateral misalignment or radial asymmetry. For example, the via formed at the second surface may not be laterally aligned with the underlying via structure partially formed at the first surface. The may be aligned enough so that the resulting opening is completely through the substrate, but the resulting fully through via may not be radially symmetric. For example, in some instances, the via at the first surface and via at the second surface may have their center locations offset by between 0.1 µm and one hundred (100) µm. In various instances, the via at the first surface and via at the second surface may have their center locations offset by between 0.5 µm and fifty (50) µm. In some instances, the via at the first surface and via at the second surface may have their center locations offset by between one (1) µm and thirty (30) µm. In various instances, the via at the first surface and via at the second surface may have their center locations offset by between one (1) µm and twenty (20) µm. In some instances, the via at the first surface and via at the second surface may have their center locations offset by between one (1) µm and ten (10) µm. In various instances, the via at the first surface and via at the second surface may have their center locations offset by between one (1) µm and five (5) µm. In some instances, the via at the first surface and via at the second surface may have their center locations offset by between one (1) µm and three (3) µm.

As a particular example, laser ablation may be used at the second surface of the via to remove a portion of the substrate to open a connection between the second surface of the substrate and a respective partial via. As another example, an etch protection material may be formed over the substrate leaving only the openings of partial vias at the first surface of the substrate an locations on the second surface of the substrate corresponding to the partial vias exposed. The substrate is then exposed to an etchant such as, for example, hydrofluoric acid (HF), potassium hydroxide (KOH), and/or sodium hydroxide (NaOH) that removes the remainder of the substrate between respective partial vias and the second surface of the substrate from both surfaces of the substrate. As yet another example, an etch protection material may be formed over the substrate leaving only the openings of partial vias at the first surface exposed. The substrate is then exposed to an etchant that removes the remainder of the substrate between respective partial vias and the second surface of the substrate from only the first surface of the substrate. As yet a further example, an etch protection material may be formed over the substrate leaving only locations on the second surface of the substrate corresponding to the partial vias exposed. The substrate is then exposed to an etchant that removes the remainder of the substrate between respective partial vias and the second surface of the substrate from only the second surface of the substrate. Based upon the disclosure provided herein, one of ordinary skill in the art will recognize a variety of processes that may be used in accordance with different embodiments for removing the remainder of the substrate to convert the partial vias to through-hole vias.

Figure 6F:
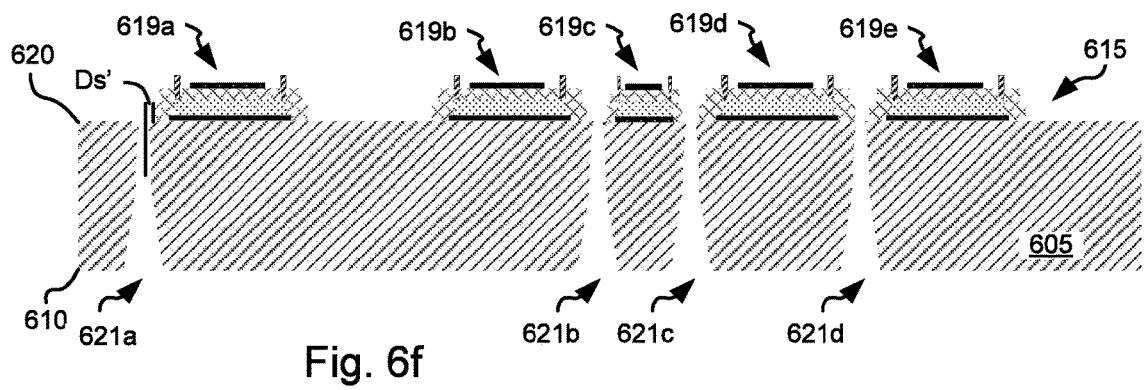

Turning to FIG. 6f, through-hole vias 621a, 621b, 621c, 621d are shown where the remainder of substrate 605 corresponding to partial vias 618a, 618b, 618c, 618d has been removed. Electronics devices 619 are spaced a distance (Ds') from the closest edge of through-hole vias 621a, 621b, 621c, 621d. Ds' is measured from an outer edge of electronic device 619a to a nearest edge of through-hole via 621a. In some embodiments, Ds' is less than five hundred (500) µm. In various embodiments, Ds' is less than two hundred (200) µm. In some embodiments, Ds' is less than one hundred (100) µm. In various embodiments, Ds' is less than fifty (50) µm. In some embodiments, Ds' is less than twenty (20) µm. In various embodiments, Ds' is less than ten (10) µm.

Where the vias are to be metalized, the process may include forming metal in the vias to create inter-layer interconnect (block 525). Such metal formation may be done using any approach known in the art for forming metal in a via. In some cases, such metallization can be partially performed as discussed above in relation to the process of block 513, or can be metalized only after the partial vias are converted to through-hole vias. Either way, full metallization is only completed after at least a portion of an electronic device is formed on the substrate. As metallization can be performed after formation of the electronic devices is complete, conformal metallization methods can be used where the via is not fully filled with conductive material. As an example, partially formed vias can be partially metallized with a metal material before completion of the electronic device. After subsequent completion of the via process after the electronic device is formed, metallization of the opened electronic via can be completed by a conductive paste applied through the second surface opening.

Figure 7:
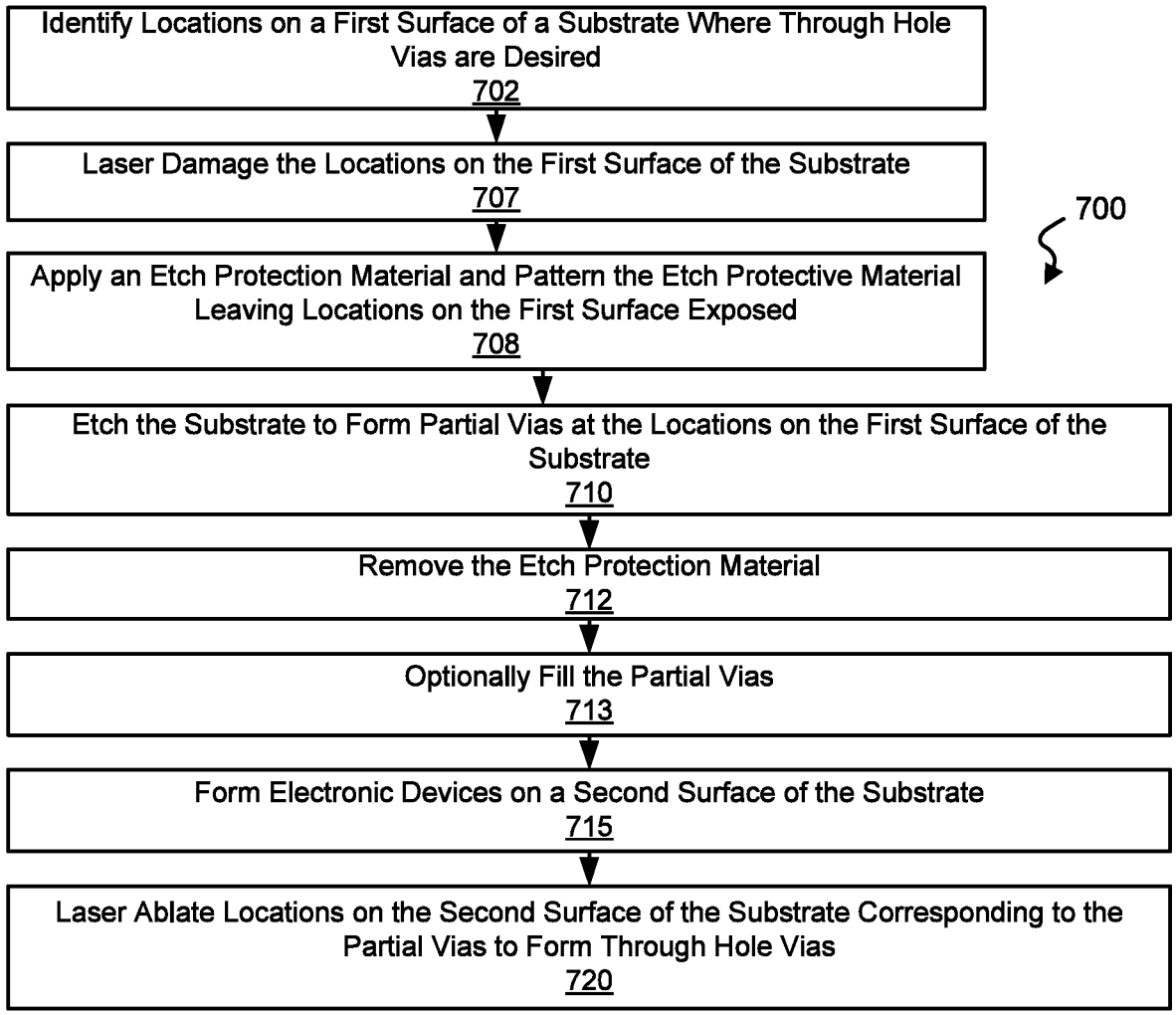
FIG. 7 is a flow diagram showing a method for manufacturing substrate systems in accordance with some embodiments that include partial etching of a via through a substrate using laser damage and an etch protection material, followed by forming an electronic device on the substrate, and later completion of the partially formed via through the substrate using laser ablation.

Turning to FIG. 7, a flow diagram 700 shows a method for manufacturing substrate systems in accordance with some embodiments where partial vias are formed before at least part of an electronic device has been formed, and later the partial vias are converted to through-hole vias by removing portions of the substrate corresponding to respective locations of the partial vias after at least part of the electronic device has been formed. Following flow diagram 700, locations on a first surface of a substrate are identified where through-hole vias are desired (block 702). The substrate may be formed of any of a number of materials including, but not limited to, glass, glass-ceramic, ceramic, polymer, or a multi-layer composite of one or more of the aforementioned materials. In some cases, the substrate is a transparent substrate. As an example, the substrate can be a Corning® EAGLE XG®, Lotus™ NXT, or other alkaline earth boro-aluminosilicate substrate. As an example, the substrate can be high purity fused silica or an alkali-ion containing glass. In such cases, substrate thickness can range between 0.1 millimeter (mm) to 1.0 mm. In various cases, substrate thickness can range between 0.1 mm to 0.7 mm. In some cases, substrate thickness can range between 0.3 mm to 0.6 mm. In some cases, the substrate has a wafer size of greater than or equal to one hundred (100) mm, greater than or equal to two hundred (200) mm, greater than or equal to three hundred (300) mm. In some cases, the substrate has panel dimension of greater than or equal to one hundred (100) mm, or greater than or equal to five hundred (500) mm, or greater than or equal to one thousand (1000) mm, or greater than or equal to three thousand (3000) mm. The aforementioned are example substrate configurations, and based upon the disclosure provided herein, one of ordinary skill in the art will recognize a variety of other substrate configurations that are possible in accordance with different embodiments.

The substrate is exposed to photonic energy from a laser light source at the identified locations where through-hole vias are desired (block 707). This exposure to the photonic energy changes at least one characteristic of the transparent substrate along defined paths extending from the first surface of the transparent substrate to the second surface of the transparent substrate. In some embodiments, the laser light source is from a laser capable of quasi-non-diffracting drilling (e.g., Gauss-Bessel or Bessel beam drilling). In some cases, the characteristic of the transparent substrate that is changed by exposure to the laser light source is density caused by a melting of the substrate along the defined paths. In various cases, the characteristic of the material that is changed by exposure to the laser light source is refractive index, which may be changed with or without a density change. Such defined paths may be alternatively referred to as "damage tracks" extending through the transparent substrate. By changing, for example, the density of the material along a defined path from the first surface of the transparent substrate to a second surface of the transparent substrate, the transparent substrate along the defined paths is made more susceptible to etching relative to other areas of the substrate. In some cases, an etch ratio of 9:1 (i.e., a rate of etch of the defined path is nine times greater than the rate of etch for areas of the transparent substrate surrounding the defined paths) is achieved. As the transparent substrate is sufficiently transparent to allow photonic energy from the laser light source to pass through, the change in characteristic of the transparent substrate along the defined paths is substantially uniform from the first surface to the second surface of the transparent substrate. In some cases, the aforementioned defined paths are compatible with thermal cycles and process conditions used for fabricating electronic devices disposed over the transparent substrate. In particular cases, to be compatible with both LTPS and oxide TFT fabrication, some embodiments can combine via pre-definition with a low-compaction transparent substrate such as Lotus NXT. Based upon the disclosure provided herein, one of ordinary skill in the art will recognize other materials from which the transparent substrate may be formed that will provide compatibility between forming the predefined paths and later electronic device formation.

An etch protection material is formed over both the first surface and the second surface of the substrate, and the etch protection material is patterned to expose locations on the first surface of the substrate corresponding to the desired locations of through-hole vias (block 708). The substrate is exposed to a wet etchant through the patterned openings in the etch protection material that expose the first surface at locations corresponding to the respective identified locations (block 710). This etching is continued long enough to form partial vias extending into the substrate. The substrate is exposed to a wet etchant through the patterned openings causing the partial vias to form in the substrate. Based upon the disclosure provided herein, one of ordinary skill in the art will recognize a variety of etchants that may use used in relation to embodiments discussed herein including, but not limited to, hydrofluoric acid (HF), potassium hydroxide (KOH), and/or sodium hydroxide (NaOH). The etch protection material is removed leaving the substrate with partial vias extending therein (block 712).

In some embodiments the partial vias are filled (block 713) or partially filled. This may be done to avoid contaminants lodging in the partial vias during later processes of, for example, forming electronic devices on the substrate. Where the partial vias are to be filled, they may be filled with a material that is readily removed or partially removed without significant impact on later formed electronic devices or the partial vias may be filled with a metal or other conductor that will form part of an electrically conductive interconnect that will be finished in a subsequent metallization process carried out after the partial vias are completed to be through-hole vias extending from the first surface to the second surface. As an example, the partial vias may be filled with one or more of: a conductor, a polymer, and/or a sol-gel.

Electronic devices are formed on the second surface of the substrate (block 715). The electronic devices may be fully formed in this process or may be only partially formed. An integrated device, module, or system based upon the substrate can utilize through-hole via structures as an electrical, optical, fluidic, and/or mechanical element. Such electronic devices may, for example, form a TFT active matrix backplane for a display device formed on the substrate. As another example, such electronic devices may form a passive matrix backplane for a display device formed on the substrate, a micro-driver integrated circuit active matrix, or direct integrated circuit electrical connectivity. Electronic devices for other products beyond display products are also possible in accordance with embodiments discussed herein. Based upon the disclosure provided herein, one of ordinary skill in the art will recognize a variety of electronic devices (either fully or partially formed) that may be formed in relation to different embodiments. In addition, embodiments may also be used for non-electronic device applications such as optical, fluidic as examples.

Locations on the second surface of the substrate corresponding to the respective partial vias are laser ablated to remove the remaining portion of the substrate and extend the partial via through to the second surface of the substrate (block 720). Any approach to removing portions of the substrate using laser energy may be used.

Where the vias are to be metalized, such metallization can be partially performed as discussed above in relation to the process of block 713, or can be metalized only after the partial vias are converted to through-hole vias. Either way, full metallization is only completed after at least a portion of an electronic device is formed on the substrate. As metallization can be performed after formation of the electronic devices is complete, conformal metallization methods can be used.

Figure 8:
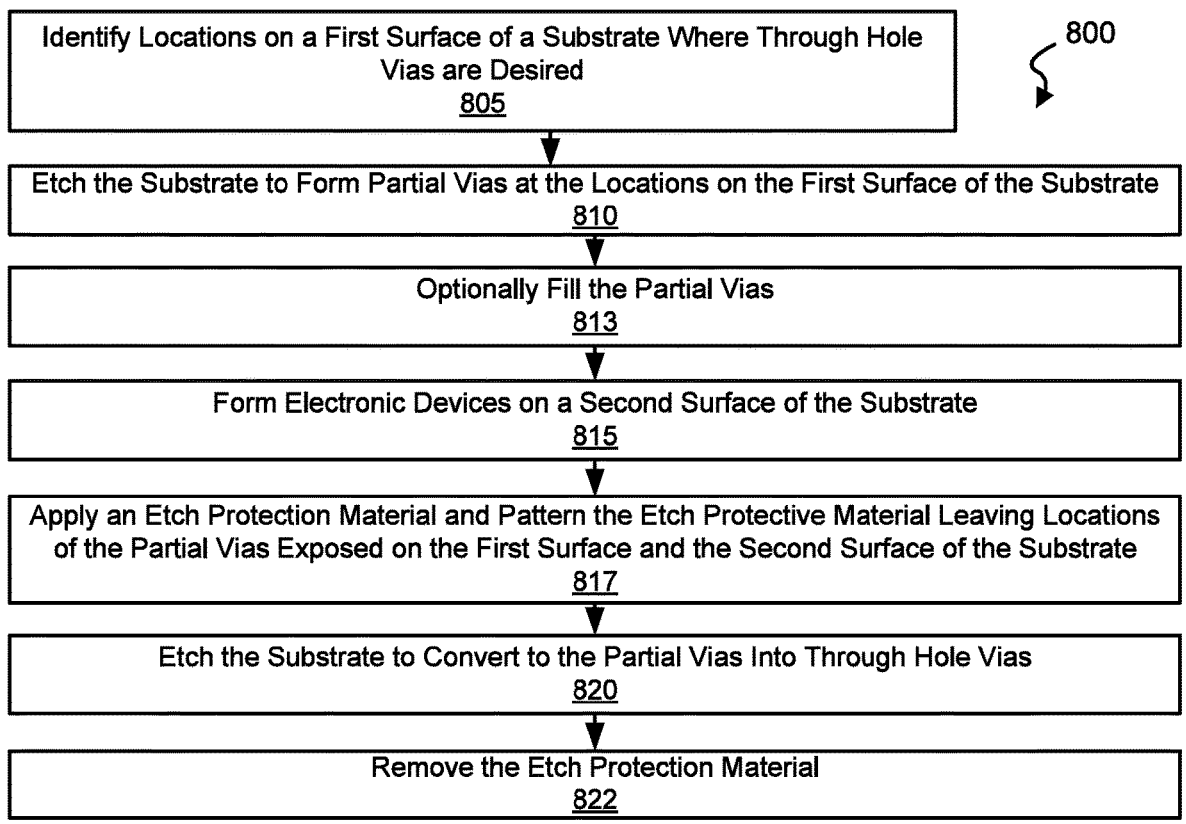
FIG. 8 is a flow diagram showing a method for manufacturing substrate systems in accordance with some embodiments that include partial etching of a via through a substrate using laser damage and an etch protection material, followed by forming an electronic device on the substrate, and later completion of the partially formed via through the substrate using an additional etching process proceeding from both ends of the partial via.

Turning to FIG. 8, a flow diagram 800 shows a method for manufacturing substrate systems in accordance with some embodiments where partial vias are formed before at least part of an electronic device has been formed, and later the partial vias are converted to through-hole vias by removing portions of the substrate corresponding to respective locations of the partial vias after at least part of the electronic device has been formed. Following flow diagram 800, locations on a first surface of a substrate are identified where through-hole vias are desired (block 805). The substrate may be formed of any of a number of materials including, but not limited to, glass, glass-ceramic, ceramic, polymer, or a multi-layer composite of one or more of the aforementioned materials. In some cases, the substrate is a transparent substrate. As an example, the substrate can be a Corning® EAGLE XG®, Lotus™ NXT, or other alkaline earth boro-aluminosilicate substrate. As an example, the substrate can be high purity fused silica or an alkali-ion containing glass. In such cases, substrate thickness can range between 0.1 millimeter (mm) to 1.0 mm. In various cases, substrate thickness can range between 0.1 mm to 0.7 mm. In some cases, substrate thickness can range between 0.3 mm to 0.6 mm. In some cases, the substrate has a wafer size of greater than or equal to one hundred (100) mm, greater than or equal to two hundred (200) mm, greater than or equal to three hundred (300) mm. In some cases, the substrate has panel dimension of greater than or equal to one hundred (100) mm, or greater than or equal to five hundred (500) mm, or greater than or equal to one thousand (1000) mm, or greater than or equal to three thousand (3000) mm. The aforementioned are example substrate configurations, and based upon the disclosure provided herein, one of ordinary skill in the art will recognize a variety of other substrate configurations that are possible in accordance with different embodiments.

Figure 9A:
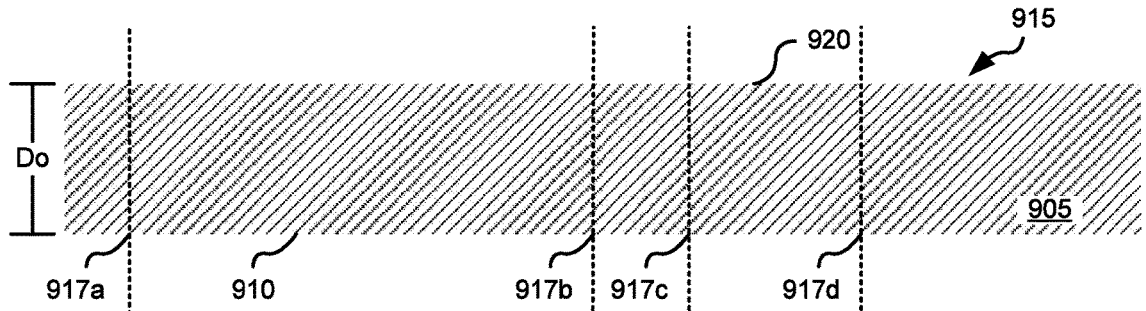
FIGS. 9a-9f show a subset of processing steps in accordance with one or more embodiments including partial etching of a via through a substrate using laser damage and an etch protection material, followed by forming an electronic device on the substrate, and later completion of the partially formed via through the substrate using an additional etching process proceeding from both ends of the partial via.

Turning to FIG. 9a, a substrate 905 is shown that has a first surface 910, a second surface 920, and identified locations 917a, 917b, 917c, 917d where through-hole vias are desired. As shown, substrate 905 has a thickness Do.

Returning to FIG. 8 and following flow diagram 800, the substrate is etched at the identified locations to form partial vias at the identified locations on the first surface of the substrate (block 810). While the embodiment is generally discussed as relying on wet etching, any approach for opening a via in the substrate can be used including, but not limited to, plasma etching, laser ablation, and/or mechanical methods. As one example, the etching may be accomplished by covering surfaces of the substrate with an etch protective material, and patterning the etch protective material to expose the first surface of the substrate at the locations identified for through-hole vias. The substrate is then exposed to a wet etchant through the patterned openings causing the partial vias to form in the substrate. Based upon the disclosure provided herein, one of ordinary skill in the art will recognize a variety of etchants that may use used in relation to embodiments discussed herein including, but not limited to, hydrofluoric acid (HF), potassium hydroxide (KOH), and/or sodium hydroxide (NaOH).

Alternatively, where the substrate is a transparent substrate, the locations on the first surface of the substrate may be exposed to photonic energy from a laser light source. This exposure to the photonic energy changes at least one characteristic of the transparent substrate along defined paths extending from the first surface substantially into the transparent substrate, and in some cases all the way through to the second surface of the transparent substrate. In some embodiments, the laser light source is from a laser capable of quasi-non-diffracting drilling (e.g., Gauss-Bessel or Bessel beam drilling). In some cases, the characteristic of the transparent substrate that is changed by exposure to the laser light source is density caused by a melting of the substrate along the defined paths. In various cases, the characteristic of the material that is changed by exposure to the laser light source is refractive index, which may be changed with or without a density change. Such defined paths may be alternatively referred to as "damage tracks" extending into or through the transparent substrate. By changing, for example, the density of the material along a defined path from the first surface of the transparent substrate to a second surface of the transparent substrate, the transparent substrate along the defined paths is made more susceptible to etching relative to other areas of the substrate. In some cases, an etch ratio of 9:1 (i.e., a rate of etch of the defined path is nine times greater than the rate of etch for areas of the transparent substrate surrounding the defined paths) is achieved. As the transparent substrate is sufficiently transparent to allow photonic energy from the laser light source to pass either all the way through the substrate or substantially into the substrate, the change in characteristic of the transparent substrate along the defined paths extends substantially into the substrate. The substrate is then exposed to an etchant resulting in partial vias being opened along the damage tracks. Based upon the disclosure provided herein, one of ordinary skill in the art will recognize a variety of etchants that may use used in relation to embodiments discussed herein including, but not limited to, hydrofluoric acid (HF), potassium hydroxide (KOH), and/or sodium hydroxide (NaOH). In some cases, the second surface is covered with an etch protective layer while the substrate is exposed to the etchant.

The partial vias extend from only one surface of the substrate while the other surface of the substrate remains protected from any damage that would occur due to the etching process. Since the partial vias represent completion of a significant portion of a later completed through-hole via, the amount of processing time to convert a partial via to a through-hole via is significantly less than that required to open a through-hole via in a single process. The reduced processing time reduces the effect of, for example, etching on electronic devices formed between formation of the partial vias and later conversion of the partial vias to through-hole vias. The depth at which the partial vias extend into the substrate is selected in some cases based upon the desired reduction of the amount of etching time that the substrate including electronic devices is to be exposed where etching is to be used to convert partial vias to through-hole vias, or based upon the amount of laser ablation that is to be used to convert partial vias to through-hole vias. In some embodiments, the partial vias extend from the first surface of the substrate into the substrate to a depth between ten (10) percent of the thickness of the substrate (e.g., Do of FIG. 9a) and ninety-five (95) percent of the thickness of the substrate (e.g., Do of FIG. 9a). In some embodiments, the partial vias extend from the first surface of the substrate into the substrate to a depth between twenty (20) percent of the thickness of the substrate and ninety (90) percent of the thickness of the substrate. In some embodiments, the partial vias extend from the first surface of the substrate into the substrate to a depth between forty (40) percent of the thickness of the substrate and ninety (90) percent of the thickness of the substrate. In various instances, the partial vias extend from the first surface of the substrate into the substrate to a depth between fifty (50) percent of the thickness of the substrate and ninety (90) percent of the thickness of the substrate. In some instances, the partial vias extend from the first surface of the substrate into the substrate to a depth between sixty (60) percent of the thickness of the substrate and ninety (90) percent of the thickness of the substrate. In other instances, the partial vias extend from the first surface of the substrate into the substrate to a depth between seventy (70) percent of the thickness of the substrate and ninety (90) percent of the thickness of the substrate.

Figure 9B:
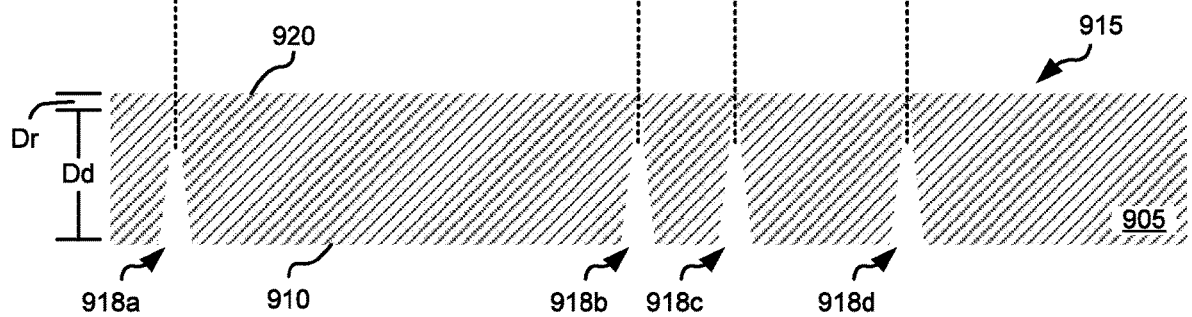

Turning to FIG. 9b, substrate 905 is shown after etching opens partial vias 918a, 918b, 918c, 918d to a depth Dd at locations 917a, 917b, 917c, 917d. Partial vias 918a, 918b, 918c, 918d only extend partially from first surface 910 to second surface 920 ending a remainder distance, Dr, from second surface 920. In various instances, Dd is between forty (40) percent and ninety-five (95) percent of Do (thus, Dr is between sixty (60) percent and five (5) percent of Do). In some embodiments Dd is between fifty (50) percent and ninety-five (95) percent of Do (thus, Dr is between fifty (50) percent and five (5) percent of Do). In various instances, Dd is between sixty (60) percent and ninety (90) percent of Do (thus, Dr is between forty (40) percent and ten (10) percent of Do). In other instances, Dd is between seventy (70) percent and ninety percent (90) of Do (thus, Dr is between thirty (30) percent and ten (10) percent of Do). Partial vias 918a, 918b, 918c, 918d can have tapered, vertical, or curved side walls. Although illustrated in FIG. 9b to be identical, the partial via can vary in diameter and depth.

Returning to FIG. 8 and following flow diagram 800, in some embodiments the partial vias are filled (block 813) or partially filled. This may be done to avoid contaminants lodging in the partial vias during later processes of, for example, forming electronic devices on the substrate. Where the partial vias are to be filled, they may be filled with a material that is readily removed or partially removed without significant impact on later formed electronic devices or the partial vias may be filled with a metal or other conductor that will form part of an electrically conductive interconnect that will be finished in a subsequent metallization process carried out after the partial vias are converted to through-hole vias extending from the first surface to the second surface. As an example, the partial vias may be filled with one or more of: a conductor, a polymer, and/or a sol-gel.

Electronic devices are formed on the second surface of the substrate (block 815). The electronic devices may be fully formed in this process or may be only partially formed. An integrated device, module, or system based upon the substrate can utilize through-hole via structures as an electrical, optical, fluidic, and/or mechanical element. Such electronic devices may, for example, form a TFT active matrix backplane for a display device formed on the substrate. As another example, such electronic devices may form a passive matrix backplane for a display device formed on the substrate, a micro-driver integrated circuit active matrix, or direct integrated circuit electrical connectivity. Electronic devices for other products beyond display products are also possible in accordance with embodiments discussed herein. Based upon the disclosure provided herein, one of ordinary skill in the art will recognize a variety of electronic devices (either fully or partially formed) that may be formed in relation to different embodiments. In addition, embodiments may also be used for non-electronic device applications such as optical, fluidic as examples.

Figure 9C:
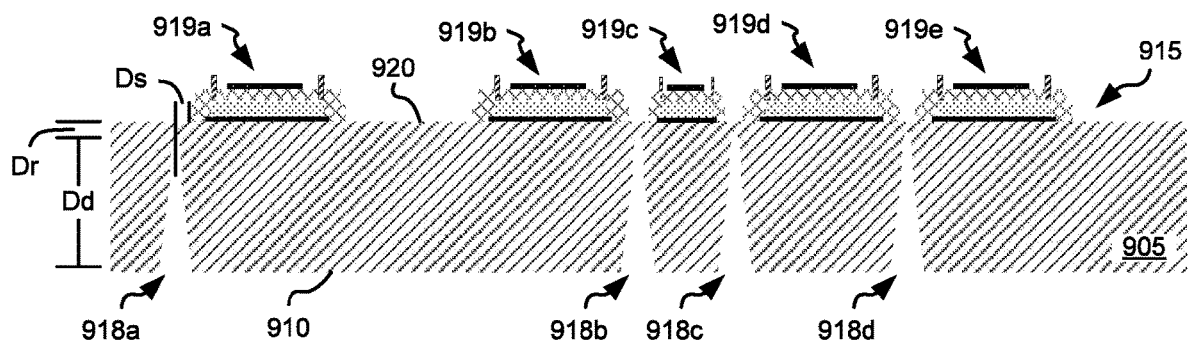

Turning to FIG. 9c, electronic devices 919a, 919b, 919c, 919d, 919e are shown formed on second surface 920 of substrate 905. Electronics devices 919 are spaced a distance (Ds) from the center of respective partially formed vias. Ds is measured from an outer edge of electronic device 919a to a center of partial via 918a. In some embodiments, Ds is less than five hundred (500) μm. In various embodiments, Ds is less than two hundred (200) μm. In some embodiments, Ds is less than one hundred (100) μm. In various embodiments, Ds is less than fifty (50) μm. In some embodiments, Ds is less than twenty (20) μm. In various embodiments, Ds is less than ten (10) μm.

Since the electronic devices are at least partially formed after partial vias are in place, the electronic devices are not exposed to a substantial part of the through-hole via forming processes. For example, where partial vias 918a, 918b, 918c, 918d extend ninety (90) percent of the way through substrate 905, electronic devices 919a, 919b, 919c, 919d, 919e are not exposed to the etching process used to open partial vias 918a, 918b, 918c, 918d. This avoids, for example, significant undercutting of electronic devices 919a, 919b, 919c, 919d, 919e during a wet etching process due to the isotropic nature of wet etching and the differential etch rates of materials. Further, where an etch protection layer is to be placed over electronic devices 919a, 919b, 919c, 919d, 919e during a later etch to convert partial vias 918a, 918b, 918c, 918d into through-hole vias, a broader choice of etch protection materials or thin layers of masking materials are possible since only a small portion of the ultimate through-hole via (i.e., the portion of substrate 905 corresponding to distance Dr) remains to be etched after formation of electronic devices 919a, 919b, 919c, 919d, 919e.

Figure 9D:
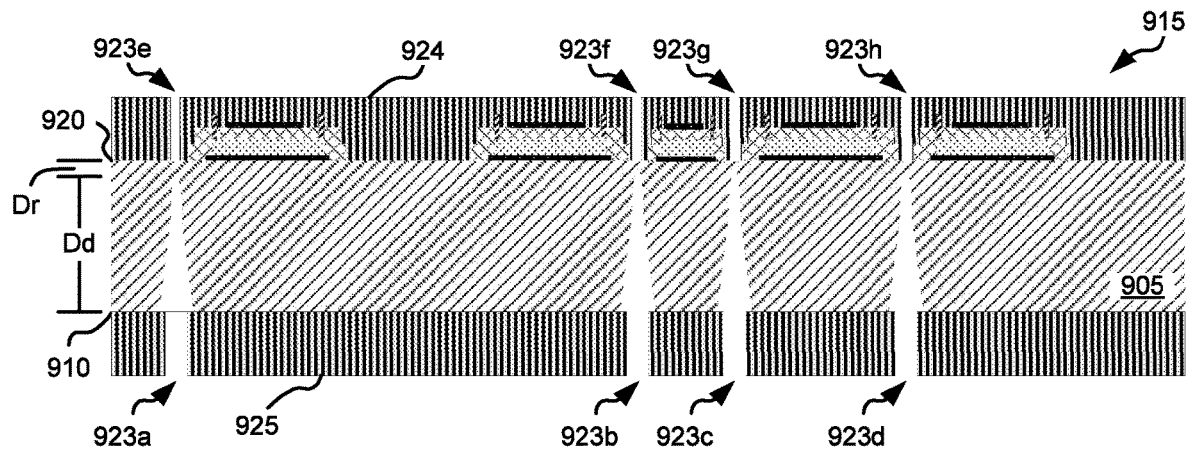

Returning to FIG. 8 and following flow diagram 800, an etch protection material is formed over both the first surface and the second surface of the substrate including the electronic devices (block 817). The etch protection material is patterned on the first surface to expose the openings of the partial vias, and the etch protection material is patterned on the second surface to expose locations on the second surface corresponding to the partial vias. Turning to FIG. 9d, substrate 905 is shown with an etch protection material formed over second surface 920 that is patterned such that openings 923e, 923f, 923g, 923h expose second surface 920 at locations corresponding to partial vias 918a, 918b, 918c, 918d, respectively. The etch protection material formed over first surface 910 is patterned such that openings 923a, 923b, 923c, 923d expose the openings of partial vias 918a, 918b, 918c, 918d, respectively.

Figure 9E:
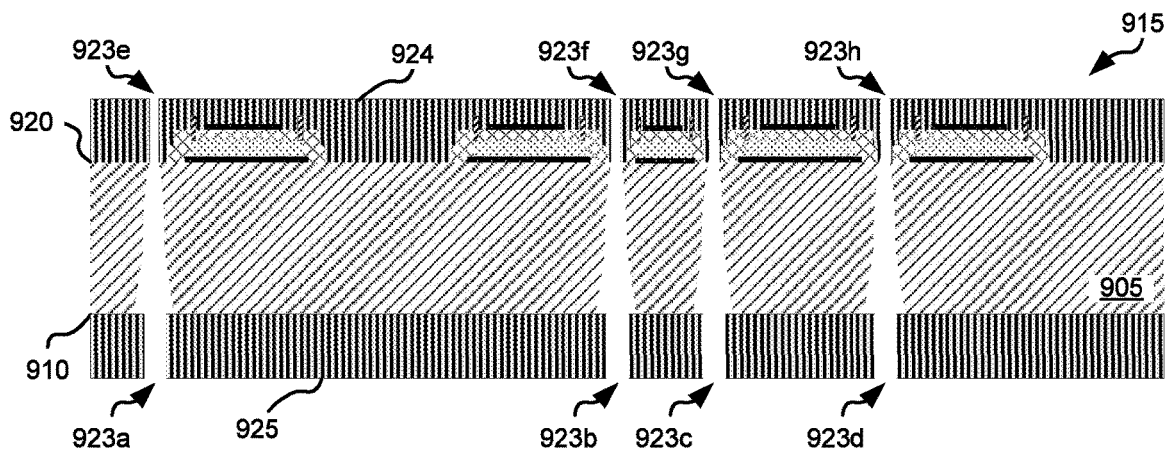

Returning to FIG. 8 and following flow diagram 800, the substrate is etched to remove the remaining portion of the substrate between the partial vias and the second surface, thus, converting the partial vias to through-hole vias (block 820). As openings have been patterned in the etch protection material on both the first and second surfaces, the etching proceeds from both the first surface and through the already opened partial vias. Turning to FIG. 9e, substrate 905 is shown after the etching process where vias extend from first surface 910 to second surface 920.

Figure 9F:
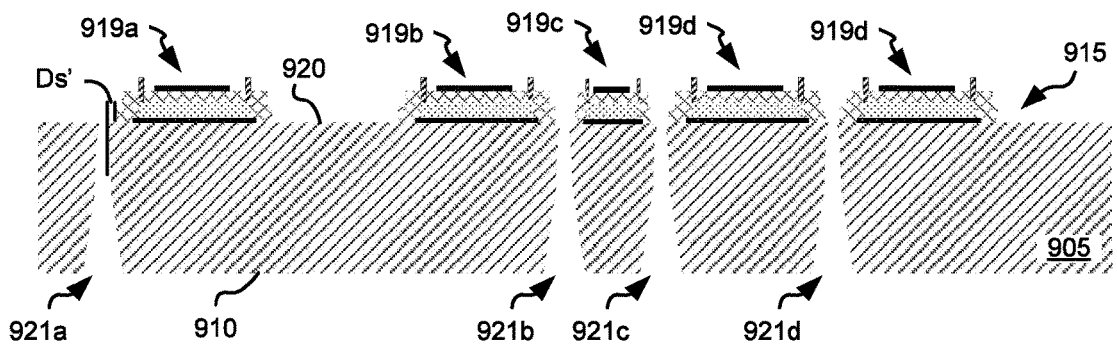

Returning to FIG. 8 and following flow diagram 800, the etch protection material is removed (block 822). Turning to FIG. 9f, through-hole vias 921a, 921b, 921c, 921d are shown where the remainder of substrate 905 corresponding to partial vias 918a, 918b, 918c, 918d has been removed. Electronics devices 919 are spaced a distance (Ds') from the closest edge of through-hole vias 921a, 921b, 921c, 921d. Ds' is measured from an outer edge of electronic device 919a to a nearest edge of through-hole via 921a. In some embodiments, Ds' is less than five hundred (500) μm. In various embodiments, Ds' is less than two hundred (200) μm. In some embodiments, Ds' is less than one hundred (100) μm. In various embodiments, Ds' is less than fifty (50) μm. In some embodiments, Ds' is less than twenty (20) μm. In various embodiments, Ds' is less than ten (10) μm.

Where the vias are to be metalized, such metallization can be partially performed as discussed above in relation to the process of block 813, or can be metalized only after the partial vias are converted to through-hole vias. Either way, full metallization is only completed after at least a portion of an electronic device is formed on the substrate. As metallization can be performed after formation of the electronic devices is complete, conformal metallization methods can be used.

Figure 10:
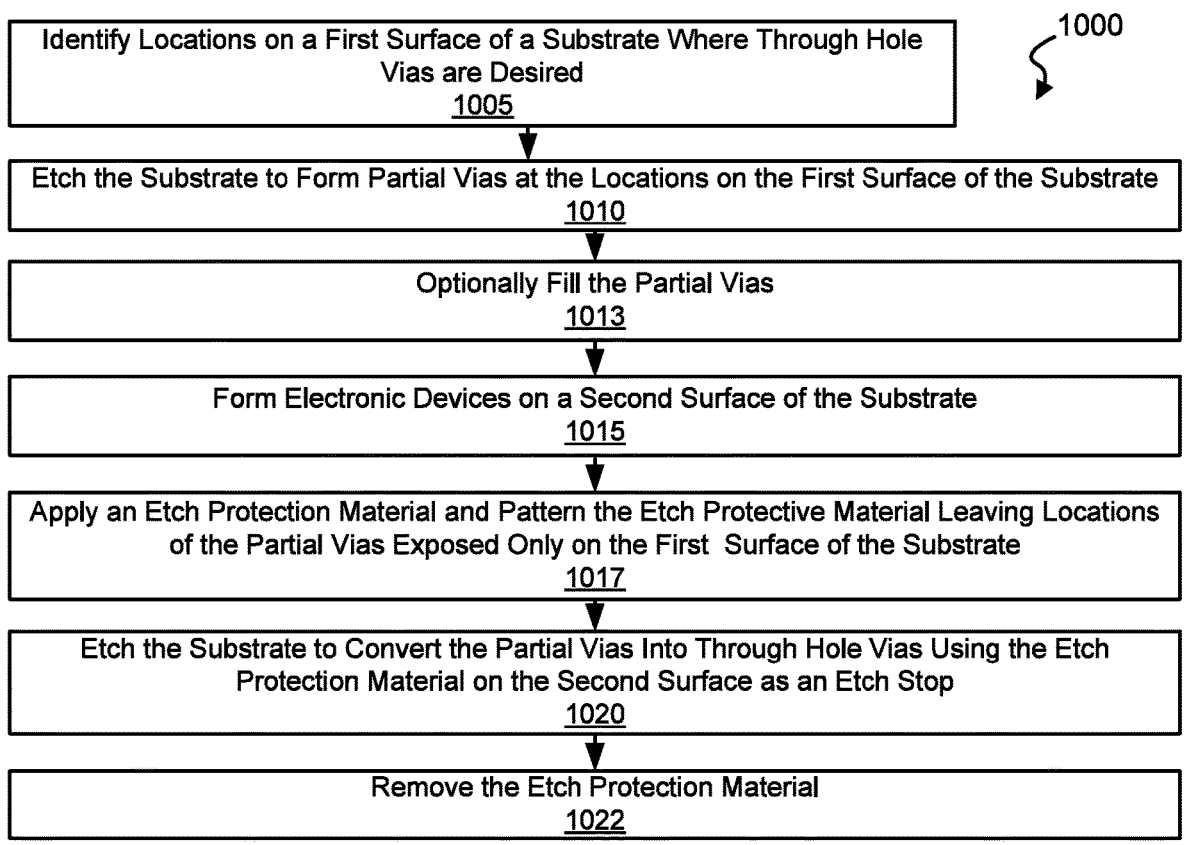
FIG. 10 is a flow diagram showing a method for manufacturing substrate systems in accordance with some embodiments that include partial etching of a via through a substrate using laser damage and an etch protection material, followed by forming an electronic device on the substrate, and later completion of the partially formed via through the substrate using an additional etching process proceeding from only the open end of the partial via.
Figure 11A:
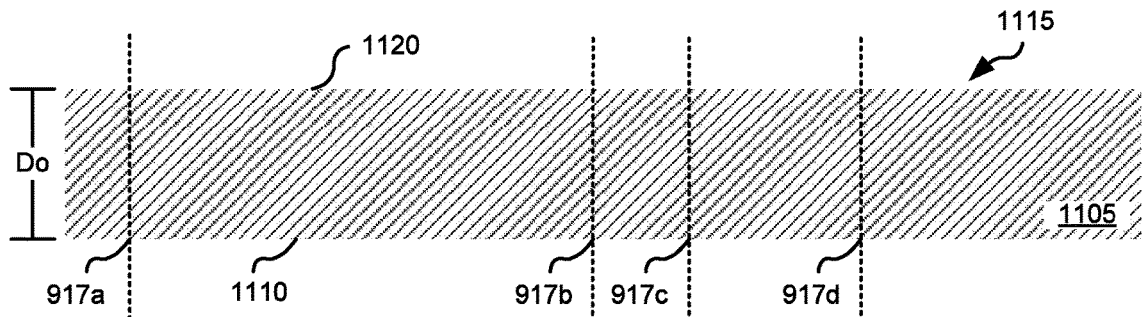
FIGS. 11a-11f show a subset of processing steps in accordance with one or more embodiments including partial etching of a via through a substrate using laser damage and an etch protection material, followed by forming an electronic device on the substrate, and later completion of the partially formed via through the substrate using an additional etching process proceeding from only the open end of the partial via.

Turning to FIG. 10, a flow diagram 1000 shows a method for manufacturing substrate systems in accordance with some embodiments where partial vias are formed before at least part of an electronic device has been formed, and later the partial vias are converted to through-hole vias by removing portions of the substrate corresponding to respective locations of the partial vias after at least part of the electronic device has been formed. Following flow diagram 1000, locations on a first surface of a substrate are identified where through-hole vias are desired (block 1005). Turning to FIG. 11a, a substrate 1105 is shown that has a first surface 1110, a second surface 1120, and identified locations 1117a, 1117b, 1117c, 1117d where through-hole vias are desired. As shown, substrate 1105 has a thickness Do.

Figure 11B:
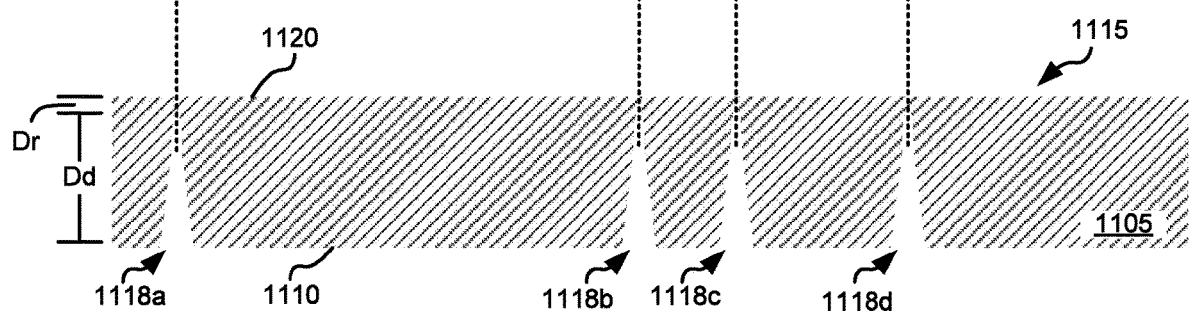

Returning to FIG. 10 and following flow diagram 1000, the substrate is etched at the identified locations to form partial vias at the identified locations on the first surface of the substrate (block 1010). While the embodiment is generally discussed as relying on wet etching, any approach for opening a via in the substrate can be used including, but not limited to, plasma etching, laser ablation, and/or mechanical methods. Turning to FIG. 11b, substrate 1105 is shown after etching opens partial vias 1118a, 1118b, 1118c, 1118d to a depth Dd at locations 1117a, 1117b, 1117c, 1117d. Partial vias 1118a, 1118b, 1118c, 1118d only extend partially from first surface 1110 to second surface 1120 ending a remainder distance, Dr, from second surface 1120. In various instances, Dd is between forty (40) percent and ninety-five (95) percent of Do (thus, Dr is between sixty (60) percent and five (5) percent of Do). In some embodiments Dd is between fifty (50) percent and ninety-five (95) percent of Do (thus, Dr is between fifty (50) percent and five (5) percent of Do). In various instances, Dd is between sixty (60) percent and ninety (90) percent of Do (thus, Dr is between forty (40) percent and ten (10) percent of Do). In other instances, Dd is between seventy (70) percent and ninety percent (90) of Do (thus, Dr is between thirty (30) percent and ten (10) percent of Do). Partial vias 1118a, 1118b, 1118c, 1118d can have tapered, vertical, or curved side walls.

Returning to FIG. 10 and following flow diagram 1000, in some embodiments the partial vias are filled (block 1013) or partially filled. This may be done to avoid contaminants lodging in the partial vias during later processes of, for example, forming electronic devices on the substrate. Where the partial vias are to be filled, they may be filled with a material that is readily removed or partially removed without significant impact on later formed electronic devices or the partial vias may be filled with a metal or other conductor that will form part of an electrically conductive interconnect that will be finished in a subsequent metallization process carried out after the partial vias are converted to through-hole vias extending from the first surface to the second surface. As an example, the partial vias may be filled with one or more of: a conductor, a polymer, and/or a sol-gel.

Electronic devices are formed on the second surface of the substrate (block 1015). The electronic devices may be fully formed in this process or may be only partially formed. An integrated device, module, or system based upon the substrate can utilize through-hole via structures as an electrical, optical, fluidic, and/or mechanical element. Such electronic devices may, for example, form a TFT active matrix backplane for a display device formed on the substrate. As another example, such electronic devices may form a passive matrix backplane for a display device formed on the substrate, a micro-driver integrated circuit active matrix, or direct integrated circuit electrical connectivity. Electronic devices for other products beyond display products are also possible in accordance with embodiments discussed herein. Based upon the disclosure provided herein, one of ordinary skill in the art will recognize a variety of electronic devices (either fully or partially formed) that may be formed in relation to different embodiments. In addition, embodiments may also be used for non-electronic device applications such as optical, fluidic as examples.

Figure 11C:
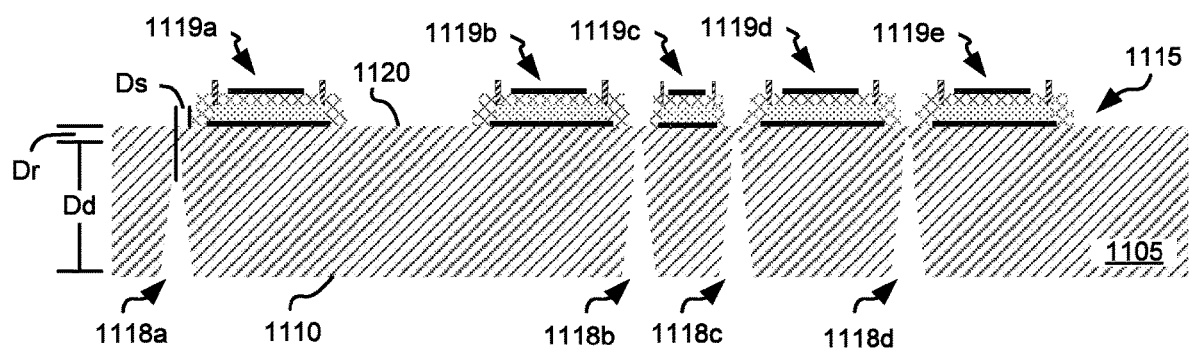

Turning to FIG. 11c, electronic devices 1119a, 1119b, 1119c, 1119d, 1119e are shown formed on second surface 1120 of substrate 1105. Electronics devices 1119 are spaced a distance (Ds) from the center of respective partially formed vias. Ds is measured from an outer edge of electronic device 1119a to a center of partial via 1118a. In some embodiments, Ds is less than five hundred (500) μm. In various embodiments, Ds is less than two hundred (200) μm. In some embodiments, Ds is less than one hundred (100) μm. In various embodiments, Ds is less than fifty (50) μm. In some embodiments, Ds is less than twenty (20) μm. In various embodiments, Ds is less than ten (10) μm. Although illustrated in FIG. 11c to be identical, the partial vias can vary in diameter and/or depth.

Figure 11D:
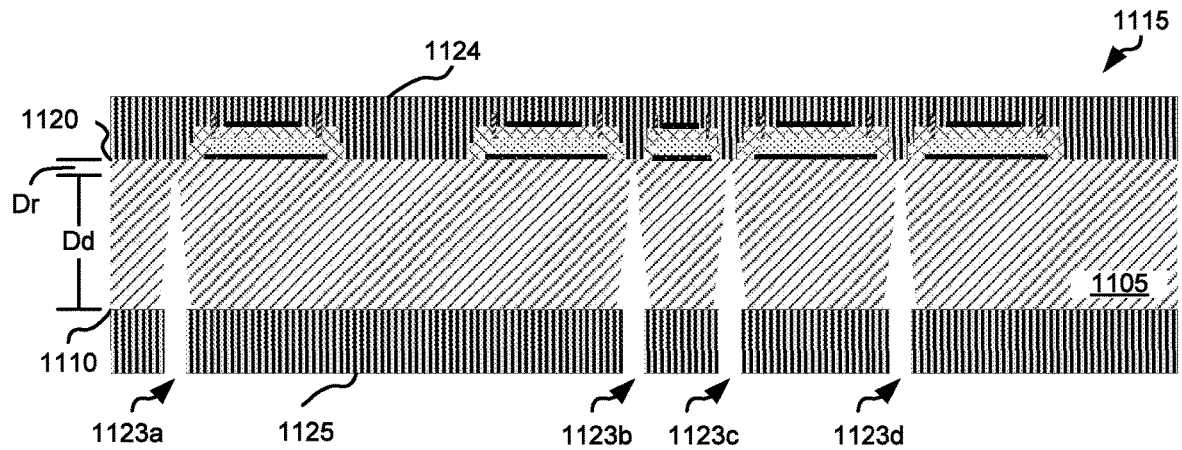

Returning to FIG. 10 and following flow diagram 1000, an etch protection material is formed over both the first surface and the second surface of the substrate including the electronic devices (block 1017). The etch protection material is patterned on the first surface to expose the openings of the partial vias. Turning to FIG. 11d, substrate 1105 is shown with an etch protection material formed over second surface 1120 that covers the entire surface including electronic devices 1119. In contrast, the etch protection material formed over first surface 1110 is patterned such that openings 1123a, 1123b, 1123c, 1123d expose the openings of partial vias 1118a, 1118b, 1118c, 1118d, respectively.

Figure 11E:
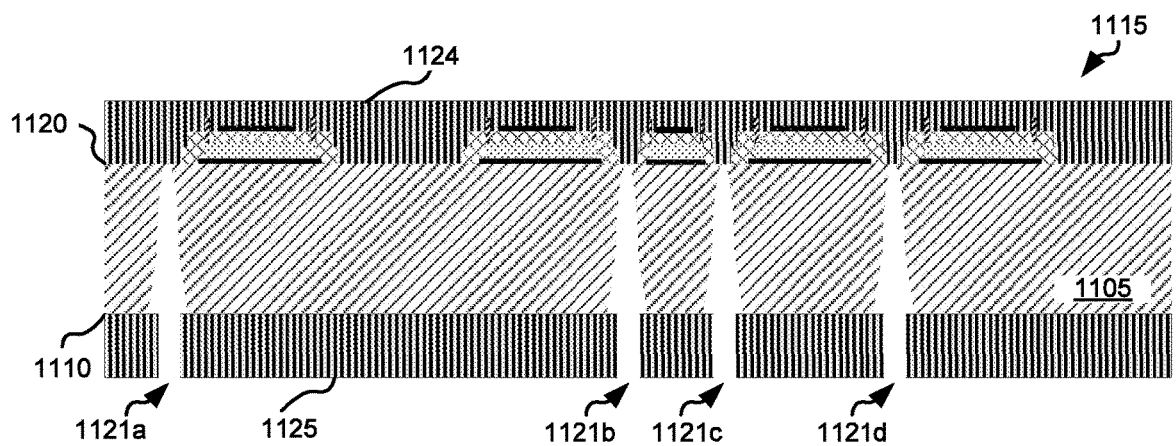

Returning to FIG. 10 and following flow diagram 1000, the substrate is etched to remove the remaining portion of the substrate between the partial vias and the second surface, thus, converting the partial vias to through-hole vias (block 1020). As openings have been patterned in the etch protection material on only the first surface of the substrate, the etching proceeds from only the already opened partial vias. Turning to FIG. 11e, substrate 1105 is shown after the etching process where vias extend from first surface 1110 to second surface 1120.

Figure 11F:
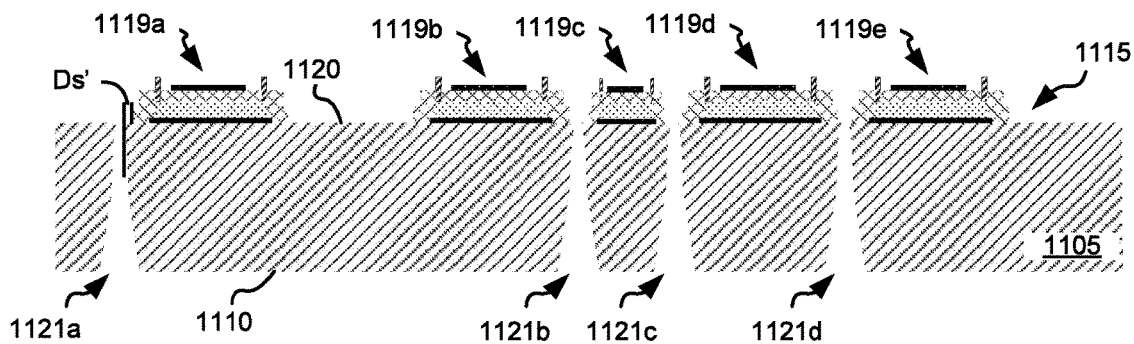

Returning to FIG. 10 and following flow diagram 1000, the etch protection material is removed (block 1022). Turning to FIG. 11f, through-hole vias 1121a, 1121b, 1121c, 1121d are shown where the remainder of substrate 1105 corresponding to partial vias 1118a, 1118b, 1118c, 1118d has been removed. Electronics devices 1119 are spaced a distance (Ds') from the closest edge of through-hole vias 1121a, 1121b, 1121c, 1121d. Ds' is measured from an outer edge of electronic device 1119a to a nearest edge of through-hole via 1121a. In some embodiments, Ds' is less than five hundred (500) μm. In various embodiments, Ds' is less than two hundred (200) μm. In some embodiments, Ds' is less than one hundred (100) μm. In various embodiments, Ds' is less than fifty (50) μm. In some embodiments, Ds' is less than twenty (20) μm. In various embodiments, Ds' is less than ten (10) μm.

Figure 12:
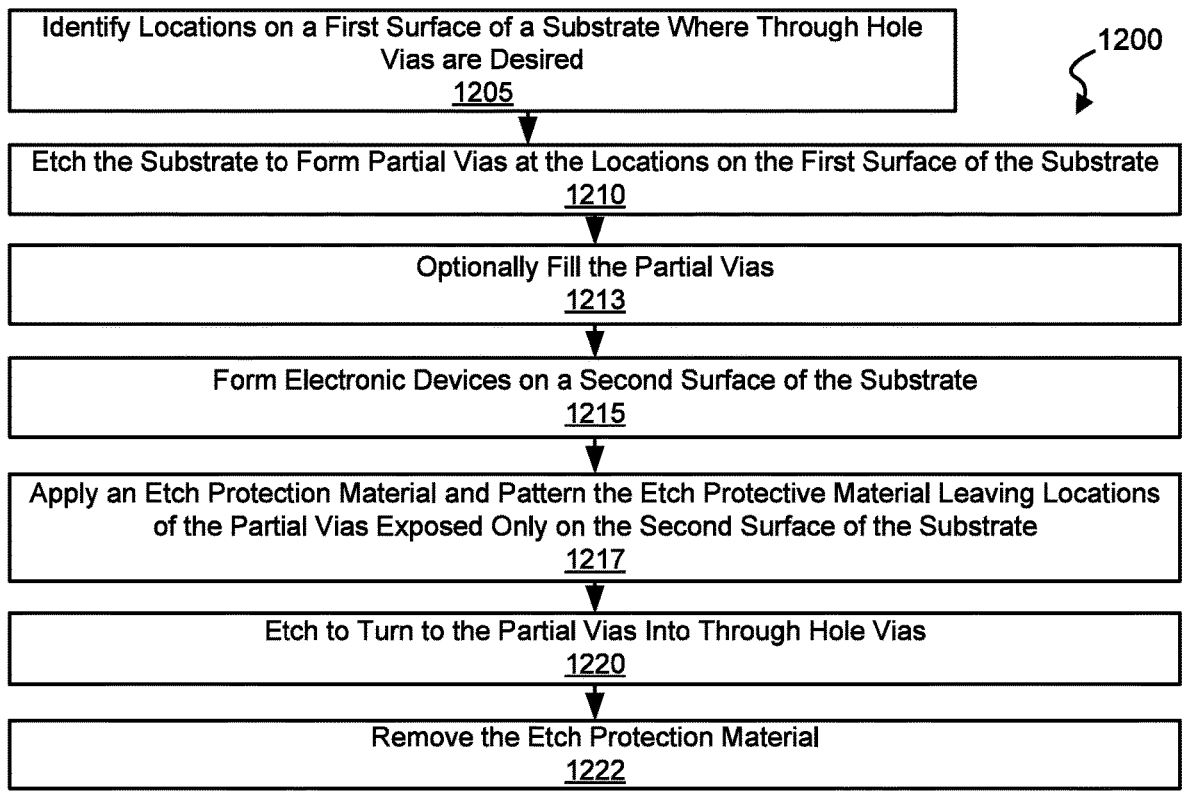
FIG. 12 is a flow diagram showing a method for manufacturing substrate systems in accordance with some embodiments that include partial etching of a via through a substrate using laser damage and an etch protection material, followed by forming an electronic device on the substrate, and later completion of the partially formed via through the substrate using an additional etching process proceeding from only the non-open end of the partial via.
Figure 13A:
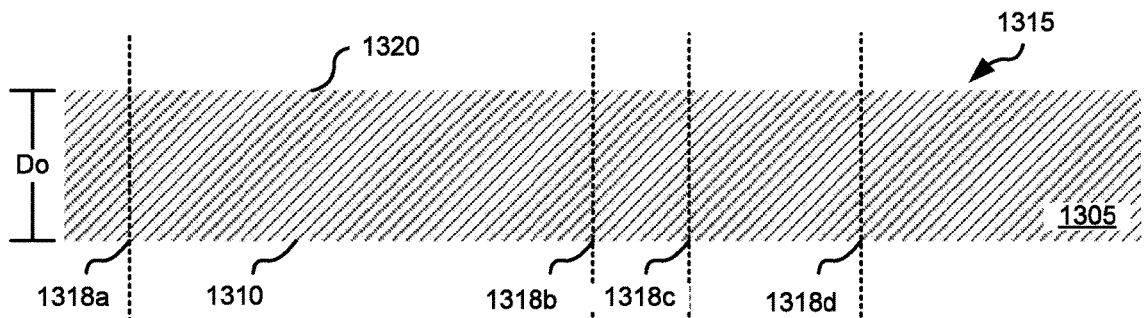
FIGS. 13a-13f show a subset of processing steps in accordance with one or more embodiments including partial etching of a via through a substrate using laser damage and an etch protection material, followed by forming an electronic device on the substrate, and later completion of the partially formed via through the substrate using an additional etching process proceeding from only the non-open end of the partial via.

Turning to FIG. 12, a flow diagram 1200 shows a method for manufacturing substrate systems in accordance with some embodiments where partial vias are formed before at least part of an electronic device has been formed, and later the partial vias are converted to through-hole vias by removing portions of the substrate corresponding to respective locations of the partial vias after at least part of the electronic device has been formed. Following flow diagram 1200, locations on a first surface of a substrate are identified where through-hole vias are desired (block 1205). Turning to FIG. 13a, a substrate 1305 is shown that has a first surface 1310, a second surface 1320, and identified locations 1317a, 1317b, 1317c, 1317d where through-hole vias are desired. As shown, substrate 1305 has a thickness Do.

Figure 13B:
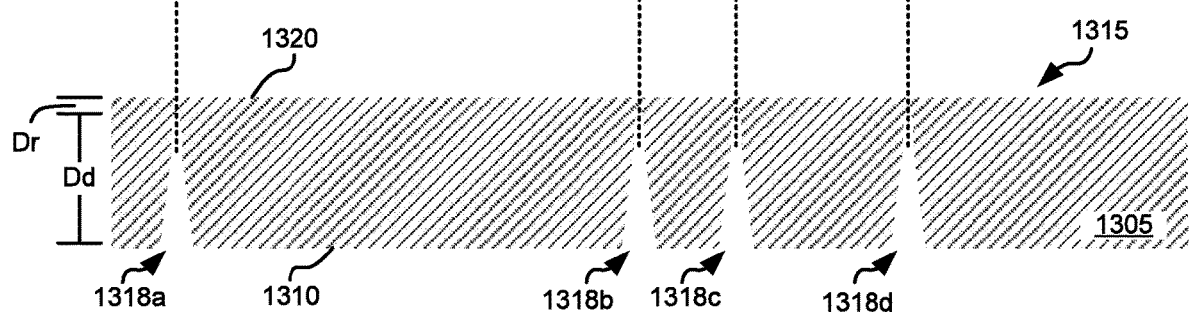

Returning to FIG. 12 and following flow diagram 1200, the substrate is etched at the identified locations to form partial vias at the identified locations on the first surface of the substrate (block 1210). While the embodiment is generally discussed as relying on wet etching, any approach for opening a via in the substrate can be used including, but not limited to, plasma etching, laser ablation, and/or mechanical methods. Turning to FIG. 13b, substrate 1305 is shown after etching opens partial vias 1318a, 1318b, 1318c, 1318d to a depth Dd at locations 1317a, 1317b, 1317c, 1317d. Partial vias 1318a, 1318b, 1318c, 1318d only extend partially from first surface 1310 to second surface 1320 ending a remainder distance, Dr, from second surface 1320. In various instances, Dd is between forty (40) percent and ninety-five (95) percent of Do (thus, Dr is between sixty (60) percent and five (5) percent of Do). In some embodiments Dd is between fifty (50) percent and ninety-five (95) percent of Do (thus, Dr is between fifty (50) percent and five (5) percent of Do). In various instances, Dd is between sixty (60) percent and ninety (90) percent of Do (thus, Dr is between forty (40) percent and ten (10) percent of Do). In other instances, Dd is between seventy (70) percent and ninety percent (90) of Do (thus, Dr is between thirty (30) percent and ten (10) percent of Do). Partial vias 1318a, 1318b, 1318c, 1318d can have tapered, vertical, or curved side walls.

Returning to FIG. 12 and following flow diagram 1200, in some embodiments the partial vias are filled (block 1213) or partially filled. This may be done to avoid contaminants lodging in the partial vias during later processes of, for example, forming electronic devices on the substrate. Where the partial vias are to be filled, they may be filled with a material that is readily removed or partially removed without significant impact on later formed electronic devices or the partial vias may be filled with a metal r other conductor that will form part of an electrically conductive interconnect that will be finished in a subsequent metallization process carried out after the partial vias are converted to through-hole vias extending from the first surface to the second surface. As an example, the partial vias may be filled with one or more of: a conductor, a polymer, and/or a sol-gel.

Electronic devices are formed on the second surface of the substrate (block 1215). The electronic devices may be fully formed in this process or may be only partially formed. An integrated device, module, or system based upon the substrate can utilize through-hole via structures as an electrical, optical, fluidic, and/or mechanical element. Such electronic devices may, for example, form a TFT active matrix backplane for a display device formed on the substrate. As another example, such electronic devices may form a passive matrix backplane for a display device formed on the substrate, a micro-driver integrated circuit active matrix, or direct integrated circuit electrical connectivity. Electronic devices for other products beyond display products are also possible in accordance with embodiments discussed herein. Based upon the disclosure provided herein, one of ordinary skill in the art will recognize a variety of electronic devices (either fully or partially formed) that may be formed in relation to different embodiments. In addition, embodiments may also be used for non-electronic device applications such as optical, fluidic as examples.

Figure 13C:
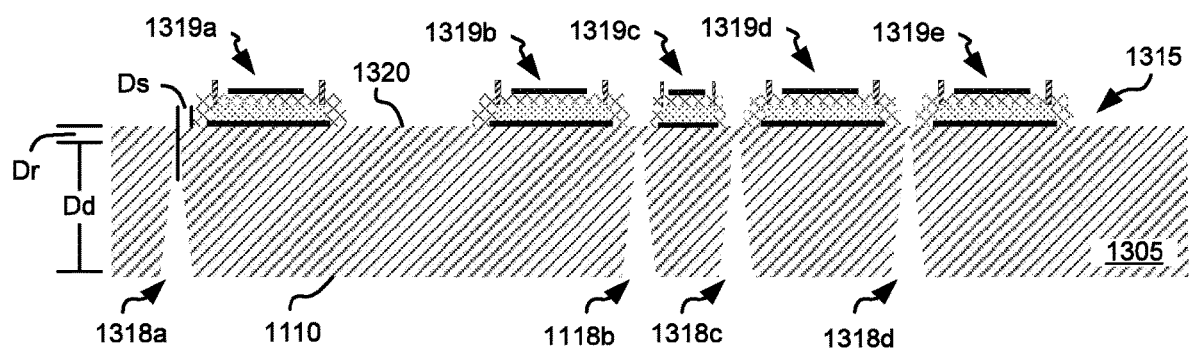

Turning to FIG. 13c, electronic devices 1319a, 1319b, 1319c, 1319d, 1319e are shown formed on second surface 1320 of substrate 1305. Electronics devices 1319 are spaced a distance (Ds) from the center of respective partially formed vias. Ds is measured from an outer edge of electronic device 1319a to a center of partial via 1318a. In some embodiments, Ds is less than five hundred (500) μm. In various embodiments, Ds is less than two hundred (200) μm. In some embodiments, Ds is less than one hundred (100) μm. In various embodiments, Ds is less than fifty (50) μm. In some embodiments, Ds is less than twenty (20) μm. In various embodiments, Ds is less than ten (10) μm. Although illustrated in FIG. 13c to be identical, the partial vias can vary in diameter and/or depth.

Figure 13D:
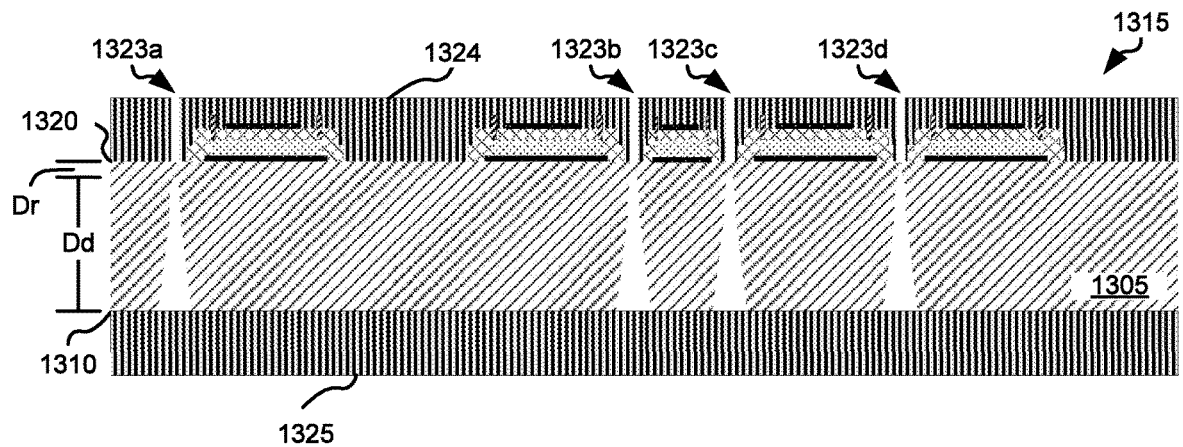

Returning to FIG. 12 and following flow diagram 1200, an etch protection material is formed over both the first surface and the second surface of the substrate including the electronic devices (block 1217). The etch protection material is patterned on the second surface to expose locations on the second surface of the substrate corresponding to the partial vias. Turning to FIG. 13d, substrate 1305 is shown with an etch protection material formed over first surface 1310 that covers the entire surface. In contrast, the etch protection material formed over second surface 1320 is patterned such that openings 1323a, 1323b, 1323c, 1323d expose locations on the second surface of the substrate corresponding to partial vias 1318a, 1318b, 1318c, 1318d, respectively.

Figure 13E:
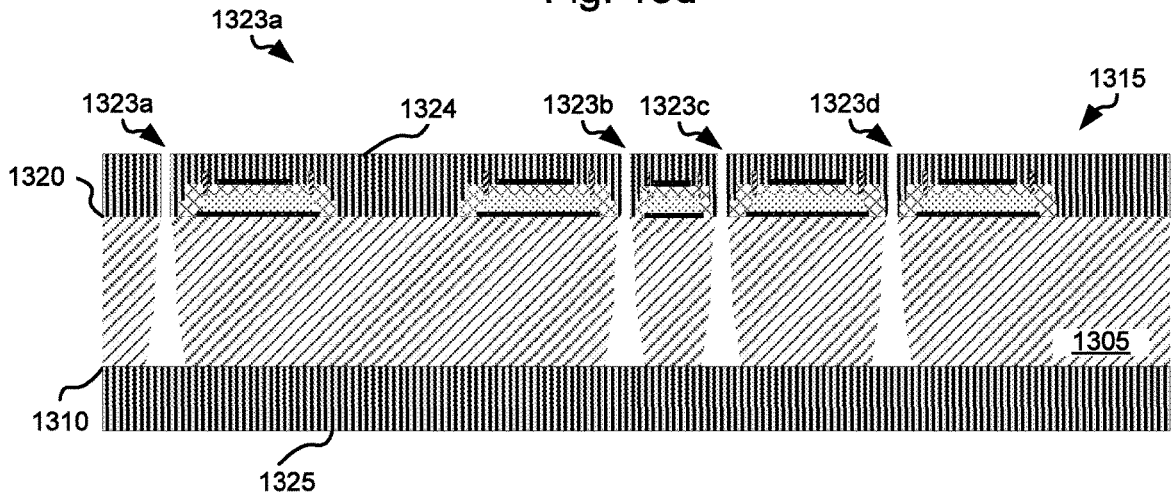

Returning to FIG. 12 and following flow diagram 1200, the substrate is etched to remove the remaining portion of the substrate between the partial vias and the second surface, thus, converting the partial vias to through-hole vias (block 1220). As openings have been patterned in the etch protection material on only the second surface of the substrate, the etching proceeds from only the second surface of the substrate. Turning to FIG. 13e, substrate 1305 is shown after the etching process where vias extend from first surface 1310 to second surface 1320.

Figure 13F:
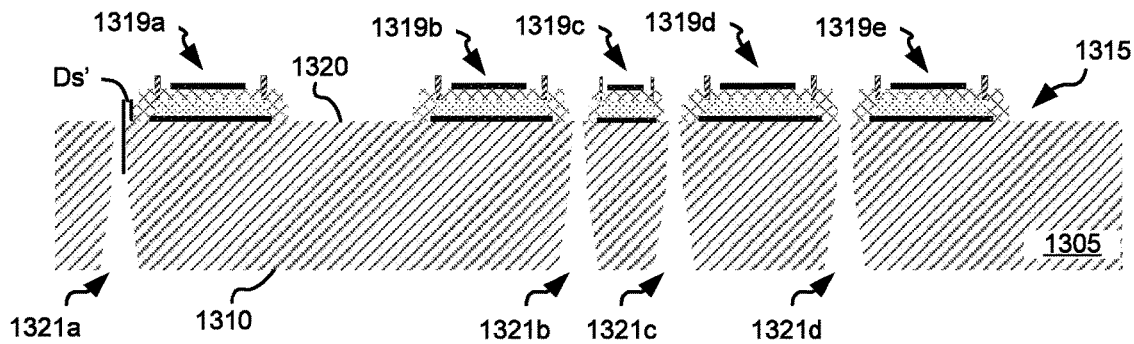

Returning to FIG. 12 and following flow diagram 1200, the etch protection material is removed (block 1222). Turning to FIG. 13f, through-hole vias 1321a, 1321b, 1321c, 1321d are shown where the remainder of substrate 1305 corresponding to partial vias 1318a, 1318b, 1318c, 1318d has been removed. Electronics devices 1319 are spaced a distance (Ds') from the closest edge of through-hole vias 1321a, 1321b, 1321c, 1321d. Ds' is measured from an outer edge of electronic device 1319a to a nearest edge of through-hole via 1321a. In some embodiments, Ds' is less than five hundred (500) μm. In various embodiments, Ds' is less than two hundred (200) μm. In some embodiments, Ds' is less than one hundred (100) μm. In various embodiments, Ds' is less than fifty (50) μm. In some embodiments, Ds' is less than twenty (20) μm. In various embodiments, Ds' is less than ten (10) μm.

In conclusion, the invention provides novel systems, devices, methods and arrangements for forming substrates including vias. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A method for processing a substrate, the method comprising:
    forming a partial via extending from a first surface of a substrate, wherein the substrate exhibits a distance between the first surface and a second surface along a line perpendicular to both the first surface and the second surface, and wherein the partial via extends into the substrate less than one hundred percent of the distance between the first surface and the second surface;
    forming a non-via structure over the second surface of the substrate and away from an area above the partial via, wherein the non-via structure is a thin film transistor; and
    after forming the non-via structure over the second surface of the substrate, removing a portion of the substrate to convert the partial via to a full via extending from the first surface of the substrate to the second surface of the substrate.

2. The method of claim 1, wherein the substrate is a transparent substrate.

3. The method of claim 1, wherein the substrate is selected from a group consisting of: a glass substrate, a glass-ceramic substrate, a ceramic substrate, and a polymer substrate.

4. The method of claim 1, wherein the partial via extends at least ten percent of the distance between the first surface and the second surface.

5. The method of claim 1, wherein the partial via extends at least twenty percent of the distance between the first surface and the second surface.

6. The method of claim 1, wherein the partial via extends at least thirty percent of the distance between the first surface and the second surface.

7. The method of claim 1, wherein the partial via extends at least fifty percent of the distance between the first surface and the second surface.

8. The method of claim 1, wherein removing the portion of the substrate to convert the partial via to the full via extending from the first surface of the substrate to the second surface of the substrate includes laser ablation from the second surface of the substrate.

9. The method of claim 1, wherein the portion of the substrate removed to convert the partial via to the full via is misaligned from the previously formed partial via by a non-zero distance when measured laterally from a center point of the partial via to a center point of the portion of the substrate removed to convert the partial via to the full via.

10. The method of claim 9, wherein the portion of the substrate removed to convert the partial via to the full via is misaligned from the previously formed partial via by less than one hundred micrometers when measured laterally from a center point of the partial via to a center point of the portion of the substrate removed to convert the partial via to the full via.

11. The method of claim 1, wherein removing the portion of the substrate to convert the partial via to the full via extending from the first surface of the substrate to the second surface of the substrate includes:
exposing the substrate to a defined wavelength of light that penetrates through the substrate at a location corresponding to the partial via to create a path from the second surface of the substrate to the partial via along which at least one characteristic of the substrate material has been changed compared with material of the substrate that was not exposed to the defined wavelength of light; and
etching the substrate using an etchant that etches the substrate material with the changed characteristic at a rate higher than the substrate material that does not exhibit the changed characteristic.

12. The method of claim 1, wherein the method further comprises:
forming a protective material over the non-via structure prior to removing the portion of the substrate to convert the partial via to the full via extending from the first surface of the substrate to the second surface of the substrate; and
wherein removing the portion of the substrate to convert the partial via to the full via extending from the first surface of the substrate to the second surface of the substrate includes wet etching from at least the second surface of the substrate.

13. The method of claim 1, wherein the method further comprises:
forming a protective material over the non-via structure prior to removing the portion of the substrate to convert the partial via to the full via extending from the first surface of the substrate to the second surface of the substrate; and
wherein removing the portion of the substrate to convert the partial via to the full via extending from the first surface of the substrate to the second surface of the substrate includes wet etching from at least the first surface of the substrate.

14. The method of claim 1, wherein forming the partial via extending from the first surface of the substrate includes exposing the substrate to a wet etch.

15. The method of claim 1, wherein the method further comprises:
forming a conductive material in the full via.

16. The method of claim 1, wherein the method further comprises:
forming a protective material in the partial via.

17. The method of claim 16, wherein the protective material is a conductive material.

18. An electronic system, the system comprising:
a substrate having a first surface and a second surface, wherein the substrate exhibits a distance between the first surface and the second surface along a line perpendicular to both the first surface and the second surface, and wherein the substrate has a partial via extending from the first surface of the substrate less than one hundred percent of the distance between the first surface and the second surface; and
a non-via structure over the second surface of the substrate and away from an area above the partial via, wherein the non-via structure is a thin film transistor.

19. The system of claim 18, wherein the substrate is a transparent substrate.

20. The system of claim 18, wherein the substrate is selected from a group consisting of: a glass substrate, a glass-ceramic substrate, a ceramic substrate, and a polymer substrate.

21. The system of claim 18, wherein the partial via extends at least ten percent of the distance between the first surface and the second surface.

22. The system of claim 18, wherein the partial via extends at least twenty percent of the distance between the first surface and the second surface.

23. The system of claim 18, wherein the partial via extends at least thirty percent of the distance between the first surface and the second surface.

24. The system of claim 18, wherein the partial via extends at least fifty percent of the distance between the first surface and the second surface.

25. The system of claim 18, wherein the partial via is at least partially filled with a material different from the material of the substrate.

26. The system of claim 18, wherein the non-via structure is covered by a protective material.

27. A method for forming a substrate including both a via and a non-via structure, the method comprising:
forming a partial via extending from a first surface of a substrate, wherein the substrate exhibits a distance between the first surface and a second surface along a line perpendicular to both the first surface and the second surface, and wherein the partial via extends into the substrate at least ten percent of the distance between the first surface and the second surface;
forming an electronic device over the second surface of the substrate and away from an area above the partial via;
forming a protective material over the electronic device; and
after forming the protective material over the electronic device, removing a portion of the substrate to convert the partial via to a full via extending from the first surface of the substrate to the second surface of the substrate.

28. The method of claim 27, wherein the portion of the substrate removed to convert the partial via to the full via is misaligned from the previously formed partial via by a non-zero distance when measured laterally from a center point of the partial via to a center point of the portion of the substrate removed to convert the partial via to the full via.

29. The method of claim 28, wherein the portion of the substrate removed to convert the partial via to the full via is misaligned from the previously formed partial via by less than one hundred micrometers when measured laterally from a center point of the partial via to a center point of the portion of the substrate removed to convert the partial via to the full via.

30. An electronic system, the system comprising:
   a substrate having a first surface and a second surface, wherein the substrate exhibits a distance between the first surface and the second surface along a first line perpendicular to both the first surface and the second surface, and wherein the substrate has a first via portion extending from the first surface of the substrate less than one hundred percent of the distance between the first surface and the second surface, and a second via portion extending from the second surface to connect with the first via portion, wherein the first via portion is centered around the first line perpendicular to both the first surface and the second surface, and wherein the second via portion is centered around a second line perpendicular to both the first surface and the second surface, and wherein the second line is laterally offset a non-zero distance from the first line; and
   a non-via structure over the second surface of the substrate and away from an area above the second via portion, wherein the non-via structure is a thin film transistor.

31. The system of claim 30, wherein the non-zero distance is between 0.1 micrometers and one hundred micrometers.

32. The system of claim 30, wherein the non-zero distance is between 0.5 micrometers and fifty micrometers.

33. The system of claim 30, wherein the non-zero distance is between one micrometer and thirty micrometers.

* * * * *